United States Patent
Nakago et al.

(10) Patent No.: US 12,033,311 B2
(45) Date of Patent: Jul. 9, 2024

(54) LEARNING DEVICE, INFERENCE DEVICE, LEARNING MODEL GENERATION METHOD, AND INFERENCE METHOD

(71) Applicant: Preferred Networks, Inc., Tokyo (JP)

(72) Inventors: Kosuke Nakago, Tokyo (JP); Daisuke Motoki, Tokyo (JP); Masaki Watanabe, Tokyo (JP); Tomoki Komatsu, Tokyo (JP)

(73) Assignee: Preferred Networks, Inc., Tokyo (JP)

( * ) Notice: Subject to any disclaimer, the term of this patent is extended or adjusted under 35 U.S.C. 154(b) by 713 days.

(21) Appl. No.: 17/189,592

(22) Filed: Mar. 2, 2021

(65) Prior Publication Data
US 2021/0183051 A1   Jun. 17, 2021

Related U.S. Application Data

(63) Continuation of application No. PCT/JP2019/032025, filed on Aug. 15, 2019.

(30) Foreign Application Priority Data

Sep. 3, 2018   (JP) ................. 2018-164930

(51) Int. Cl.
G06K 9/00   (2022.01)
G06N 3/08   (2023.01)
G06T 7/00   (2017.01)

(52) U.S. Cl.
CPC ............. *G06T 7/0004* (2013.01); *G06N 3/08* (2013.01); *G06T 2207/20081* (2013.01); *G06T 2207/20084* (2013.01); *G06T 2207/30148* (2013.01)

(58) Field of Classification Search
CPC ......... G06T 7/0004; G06T 2207/20081; G06T 2207/20084; G06T 2207/30148;
(Continued)

(56) References Cited

U.S. PATENT DOCUMENTS 6,819,427 B1 *  11/2004  Subramanian ......... G01N 21/55
356/237.1
2007/0249182 A1 *  10/2007  Mani ..................... H01L 29/518
438/785

(Continued)

FOREIGN PATENT DOCUMENTS

CN      107615310      1/2018
JP      2005-202949    7/2005
(Continued)

OTHER PUBLICATIONS

U.S. Appl. No. 17/189,608, filed Mar. 2, 2021, Preferred Networks, Inc. et al.
(Continued)

*Primary Examiner* — Andrew M Moyer
(74) *Attorney, Agent, or Firm* — IPUSA, PLLC

(57) ABSTRACT

With respect to an inference method performed by at least one processor, the method includes inputting, by the at least one processor, into a learned model, second non-processed image data and second parameter data of a simulator, and inferring, by the at least one processor using the learned model, second processed image data. The learned model has been trained so that first processed image data, obtained as an output in response to first non-processed image data and first parameter data of the simulator for the first non-processed image data being input, approaches first simulator processed image data, obtained as a result of the simulator for the first non-processed image data by using the first parameter data.

29 Claims, 15 Drawing Sheets

(58) Field of Classification Search
CPC ......... G06N 3/08; G06N 3/045; G06N 20/00; C23C 14/54; C23C 16/52; H01L 21/00; H01L 21/02; H01L 21/3065; H01L 21/67069; H01L 21/67063
See application file for complete search history.

(56) References Cited

U.S. PATENT DOCUMENTS

| | | | | |
|---|---|---|---|---|
| 2014/0097362 | A1* | 4/2014 | Carroll | H01J 37/3175 250/492.22 |
| 2015/0149970 | A1 | 5/2015 | Kuboi et al. | |
| 2017/0256466 | A1* | 9/2017 | Bishop | H01L 21/78 |
| 2018/0082178 | A1 | 3/2018 | Nakamura et al. | |
| 2019/0258169 | A1* | 8/2019 | Wang | G03F 7/70558 |
| 2019/0311083 | A1* | 10/2019 | Feng | G03F 1/36 |
| 2021/0305070 | A1* | 9/2021 | Kagami | H01J 37/3244 |

FOREIGN PATENT DOCUMENTS

| | | |
|---|---|---|
| JP | 2015-103769 | 6/2015 |
| KR | 2002-0085688 | 11/2002 |
| KR | 10-2004-0080742 | 9/2004 |

OTHER PUBLICATIONS

Shim, Seongbo, Shin, Youngsoo "Etch proximity correction through machine-learning-driven etch bias model" SPIE Advanced Lithography, Mar. 23, 2016.
Seongbo Shim, Suhyeong Choi, and Youngsoo Shin "Machine Learning (ML)-Based Lithography Optimizations" 2016 IEEE.
Byungwhan Kim, Duk Woo Lee, and Kwang Ho Kwon "Prediction of etch microtrenching using a neural network", Journal of Applied Physics, AIP Publishing, Submitted: Feb. 23, 2004 . Accepted: Jul. 13, 2004 . Published Online: Sep. 23, 2004.
Ryohei Orihara et al., "Approximation of Time-Consuming Simulation Based on Generative Adversarial Network", 2018 42nd IEEE International Conference on Computer Software & Applications, p. 171-p. 176.
Ethan Perez et al., "FiLM: Visual Reasoning with a General Conditioning Layer", 2018, Association for the Advancement of Artificial Intelligence. Revised Dec. 18, 2017, <URL:https://arxiv.org/abs/1709.07871>.
Olaf Ronneberger et al."U-Net: Convolutional Networks for Biomedical Image Segmentation", May 27, 2018 version, <URL:https://web.archive.org/web/20180527090545/https://lmb.informatik.uni-freiburg.de/people/ronneber/u-net/>.
Takamitsu Kakinaga et al."Simulation of Anisotropic Chemical Etching of Single Crystalline Silicon using Cellular-Automata" IEEJ Trans.AM.vol. 124.No.1.2004.
E. Strasser and S. Selberherr "A General Simulation Method for Etching and Deposition Processes" Sep. 1993.
"Predicting plasma in wafer etch and deposition via quantum mechanics",Sep. 15, 2014 version,<URL:https://web.archive.org/web/20140915130427/http://electroiq.com/blog/2011/11/predicting-plasma-in-wafer-etch-and-deposition-via-quantum-mechanics/>Author unlisted.
Jonathan Tompson et al."Accelerating Eulerian Fluid Simulation With Convolutional Networks" Revised Jun. 22, 2017.
Jonathan Tompson et al."Accelerating Eulerian Fluid Simulation With Convolutional Networks", Oct. 18, 2017 version,<https://web.archive.org/web/20171018202802/http://cims.nyu.edu/~schlacht/CNNFluids.htm>.
Justin Gilmer et al."Neural Message Passing for Quantum Chemistry" Revised Jun. 12, 2017.
"Automatic Measurement on Etched Structure in Semiconductor Using Deep Learning Approach" ICLR 2018, Author unlisted.
"General Purpose 1D, 2D Process Simulator" Silvaco Athena, May 19, 2017 version, <URL:https://web.archive.org/web/20170519115933/https://www.silvaco.com/products/tcad/process_simulation/athena/athena.html>Author unlisted.
"2D Core Process Simulator" SSuprem4, May 25, 2017 version,<URL:https://web.archive.org/web/20170525142055/https://www.silvaco.com/products/vwf/athena/ss4/ss4_br.html>Author unlisted.
"An advanced 1D and 2D process simulator" Taurus TSUPREM-4, Oct. 22, 2020 version,<URL:https://web.archive.org/web/20201022182550/https://www.synopsys.com/silicon/tcad/process-simulation/taurus-tsuprem-4.html> Author unlisted.
"Sentaurus Process An advanced 1D, 2D and 3D process simulator" Synopsys, Sep. 19, 2020 version,<URL: https://web.archive.org/web/20200919002904/https://www.synopsys.com/silicon/tcad/process-simulation/sentaurus-process.html>Author unlisted.
Olaf Ronneberger et al."U-Net: Convolutional Networks for Biomedical Image Segmentation", Revised May 18, 2015, <URL:https://arxiv.org/pdf/1505.04597.pdf>.
G. Erten, A. Gharbi et al."Using Neural Networks To Control The Process of Plasma Etching and Deposition" Appeared in Proc. of International Conference on Neural Networks, pp. 1091-1096, Jul. 1996<URL:https://www.researchgate.net/publication/3652150_Using_neural_networks_to_control_the_process_of_plasma_etching_and_deposition>.
Tiffany Wu, Brian Salazar, "Modeling a Deep Reactive Ion Etching (DRIE) Process," <URL:https://nanohub.org/resources/28831.>Aug. 15, 2018.
Modeling DRIE<URL:https://nanohub.org/resources/28831.>Author unlisted, Aug. 15, 2018.

\* cited by examiner

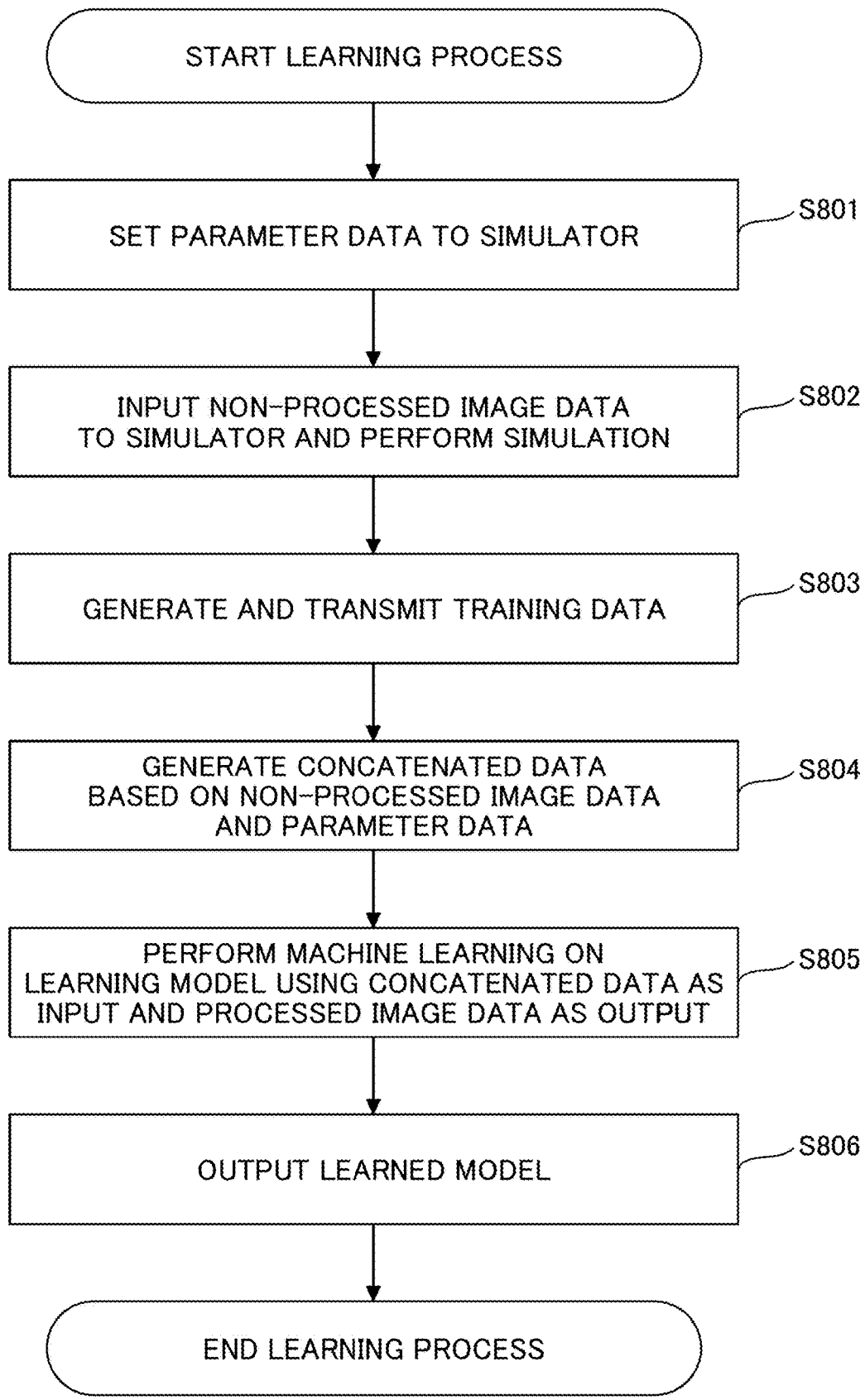

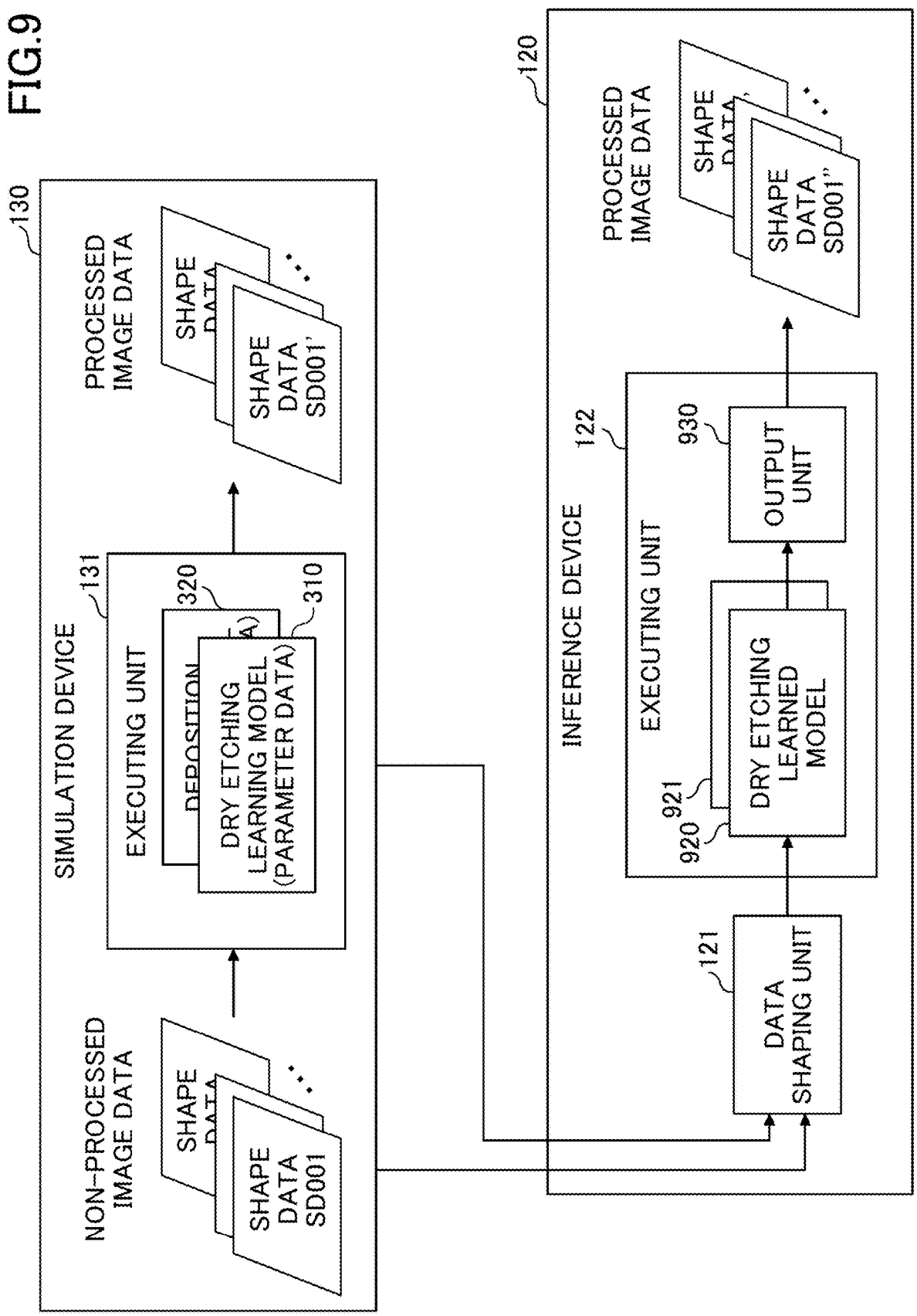

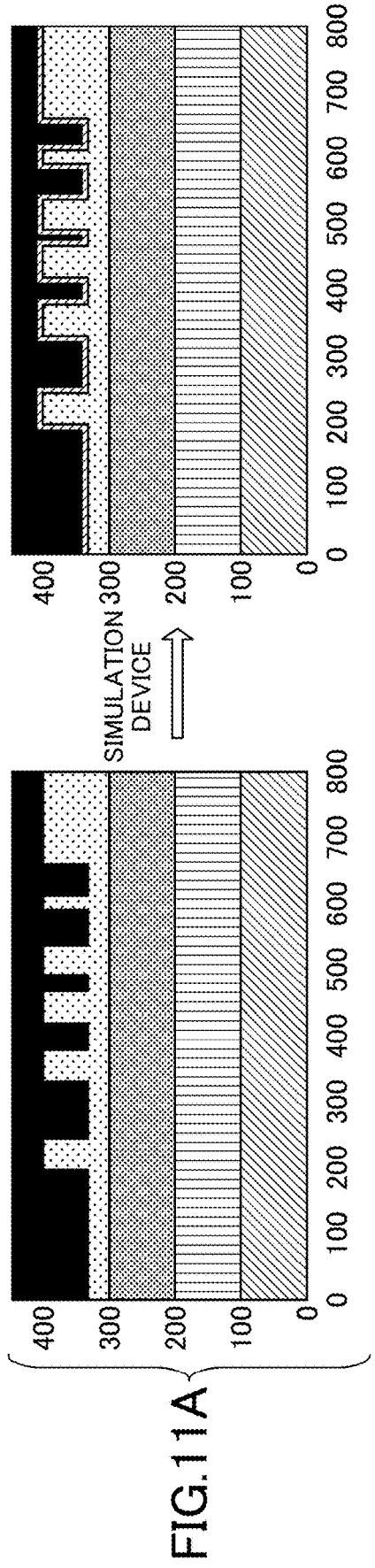
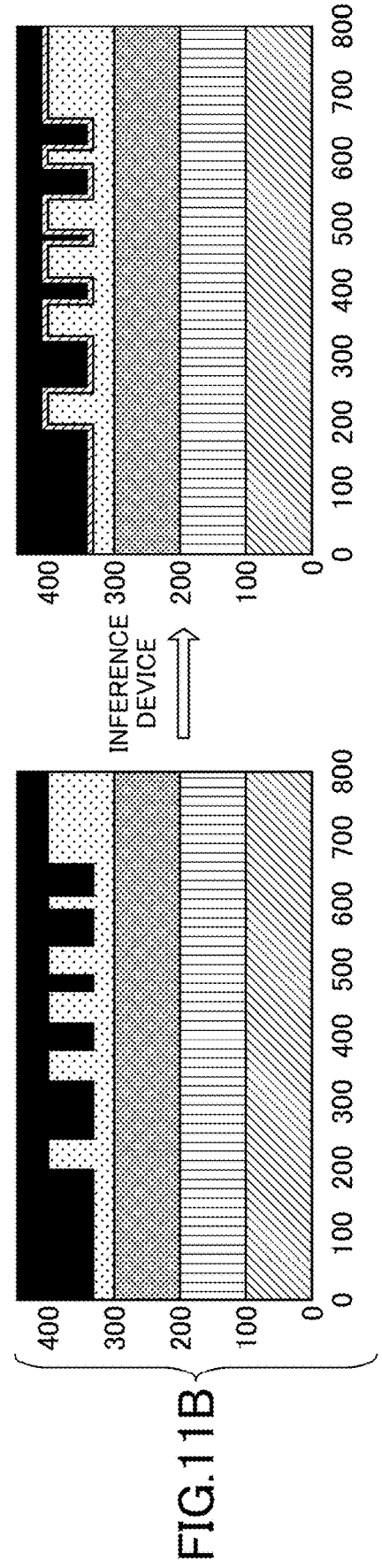

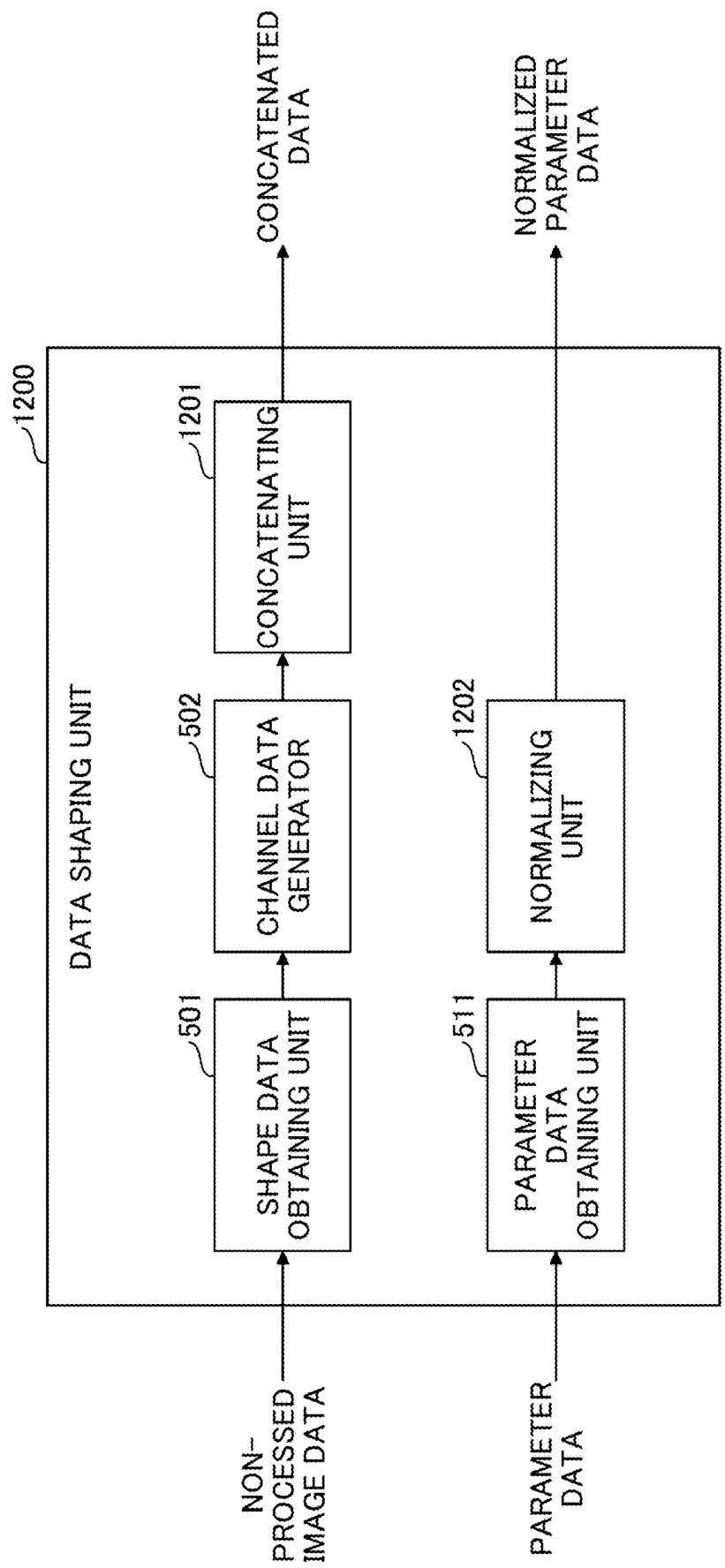

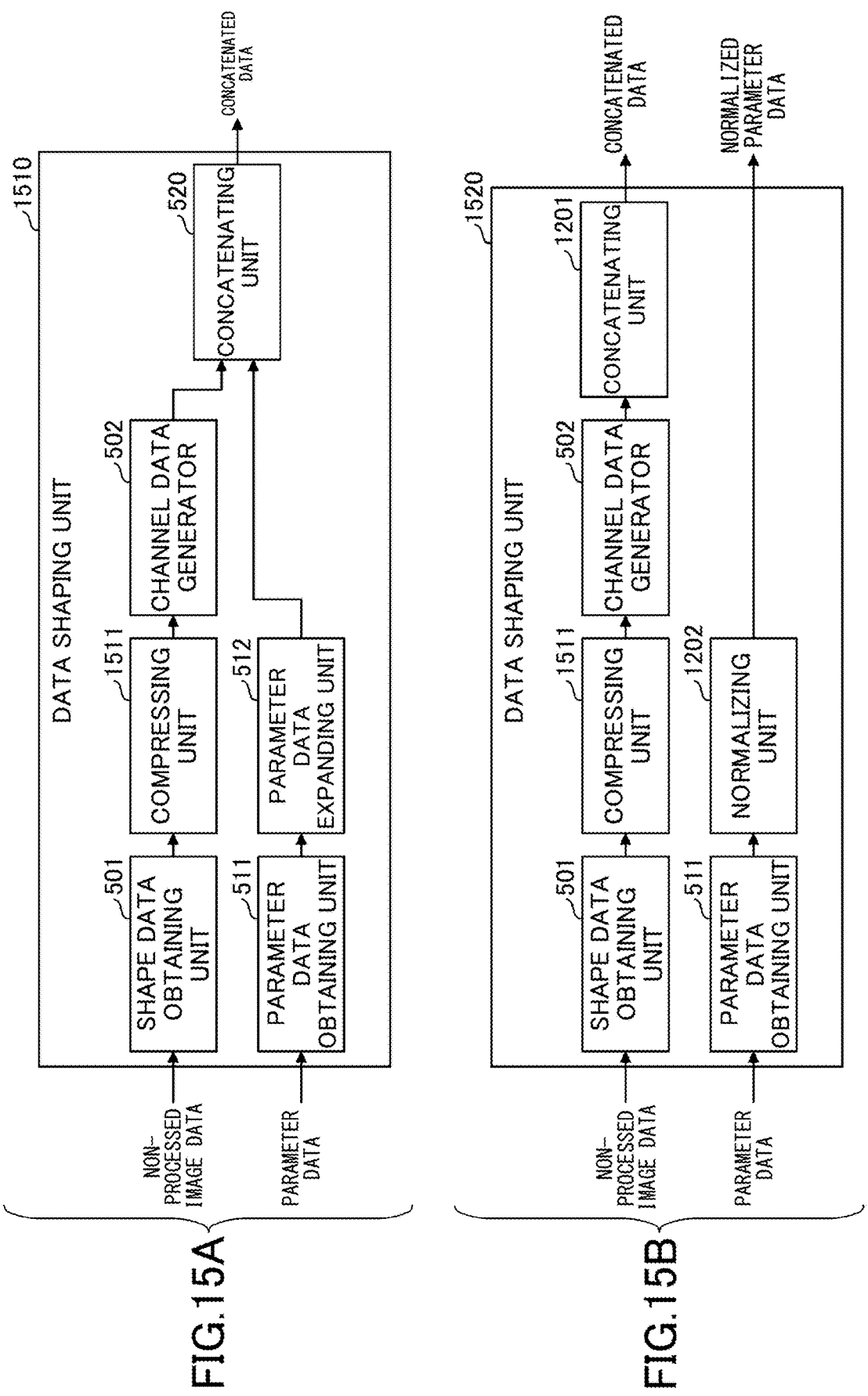

LEARNING DEVICE, INFERENCE DEVICE, LEARNING MODEL GENERATION METHOD, AND INFERENCE METHOD

CROSS-REFERENCE TO RELATED APPLICATIONS

This application is a continuation application of International Application No. PCT/JP2019/032025 filed on Aug. 15, 2019, and designating the U.S., which is based upon and claims priority to Japanese Patent Application No. 2018-164930, filed on Sep. 3, 2018, the entire contents of which are incorporated herein by reference.

BACKGROUND

1. Technical Field

The disclosure herein relates to a learning device, an inference device, a learning model generation method, and an inference method.

2. Description of the Related Art

Semiconductor manufacturers generate physical models of respective manufacturing processes (e.g., dry etching and deposition) and perform simulations to search for optimal recipes and to adjust process parameters based on simulation results.

Here, in models in which trials are repeatedly performed, such as physical models, a certain amount of time is required to perform simulations. Thus, in recent years, the application of models learned by using machine learning is studied as an alternative to simulators based on physical models.

With respect to the above, in order to replace simulators based on physical models, it is required to reproduce simulations performed in the simulators even in the learned model.

The present disclosure provides a learned model to replace a simulator of a manufacturing process.

SUMMARY

According to one aspect of the present disclosure, with respect to an inference method performed by at least one processor, the method includes inputting, by the at least one processor, into a learned model, second non-processed image data and second parameter data of a simulator, and inferring, by the at least one processor using the learned model, second processed image data. The learned model has been trained so that first processed image data, obtained as an output in response to first non-processed image data and first parameter data of the simulator for the first non-processed image data being input, approaches first simulator processed image data, obtained as a result of the simulator for the first non-processed image data by using the first parameter data.

BRIEF DESCRIPTION OF THE DRAWINGS

FIG. 8 is a flowchart illustrating a flow of a learning process in the simulation system;

FIG. 9 is a drawing illustrating an example of a functional configuration of an executing unit of an inference device;

FIG. 11A and FIG. 11B are drawings illustrating the simulation accuracy of a deposition learned model;

FIG. 12 is a drawing illustrating an example of a functional configuration of a data shaping unit of a learning device according to a second embodiment;

FIG. 15A and FIG. 15B are drawings illustrating an example of a functional configuration of a data shaping unit of a learning device according to a fourth embodiment.

DETAILED DESCRIPTION

Figure 1:
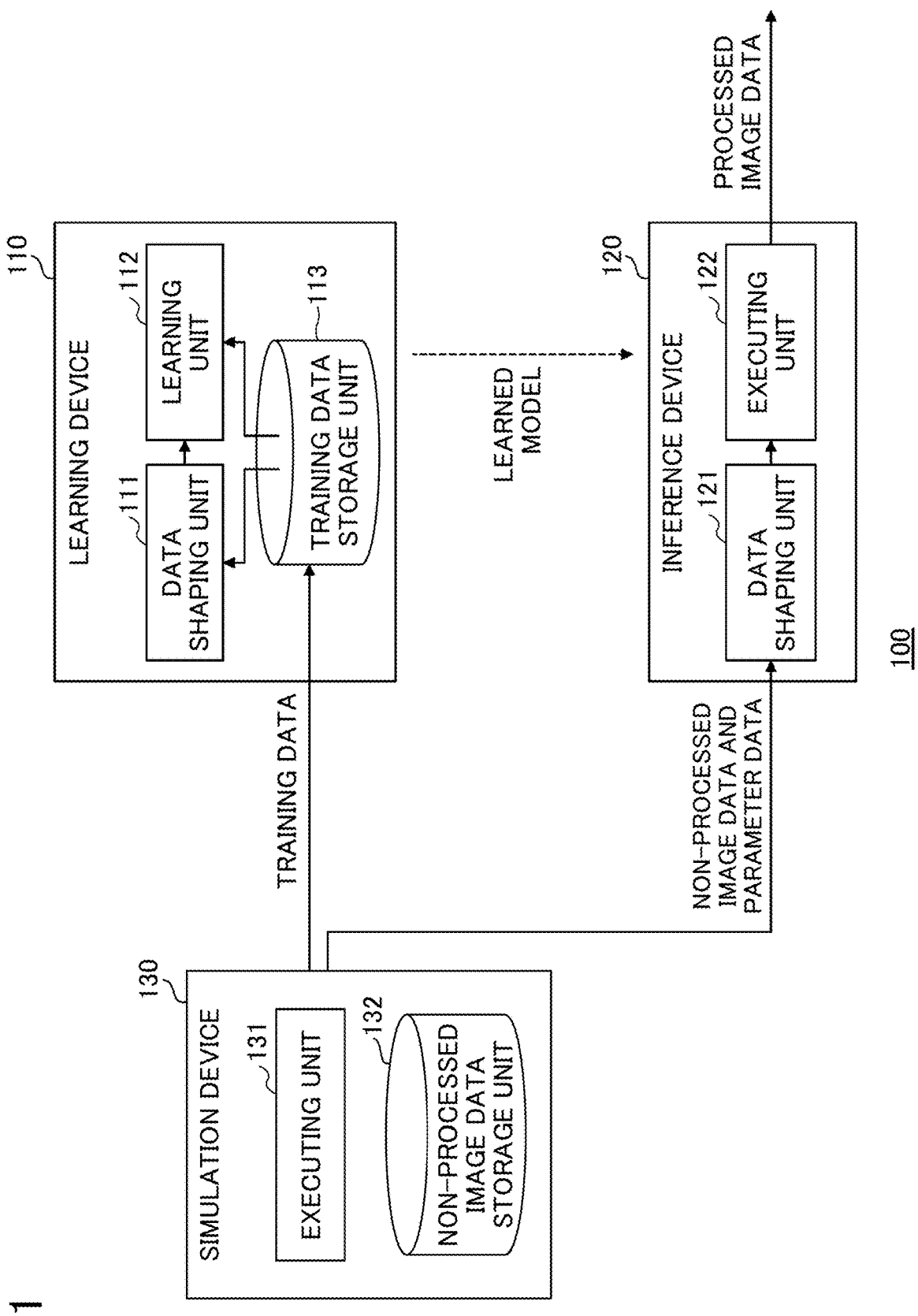
FIG. 1 is a drawing illustrating an example of an overall configuration of a simulation system.

In the following, embodiments will be described in detail with reference to the accompanying drawings. In the present specification and the drawings, components having substantially the same functional configuration are referenced by the same reference numerals, and overlapping description is omitted.

First Embodiment

<Overall Configuration of a Simulation System>

First, an overall configuration of a simulation system that simulates a semiconductor manufacturing process will be described. FIG. 1 is a drawing illustrating an example of the overall configuration of the simulation system. As illustrated in FIG. a simulation system 100 includes a learning device 110, an inference device 120, and a simulation device 130.

In the learning device 110, a data shaping program and a learning program are installed, and when the programs are executed, the learning device 110 functions as a data shaping unit 111 and a learning unit 112.

The data shaping unit 111 is an example of a processing unit. The data shaping unit 111 reads training data that is transmitted from the simulation device 130 and that is stored in a training data storage unit 113, and processes a portion of the read training data into a predetermined format suitable for being input to a learning model by the learning unit 112.

The learning unit 112 uses the read training data (including the training data processed by the data shaping unit 111) to perform machine learning on the learning model and generate a learned model of the semiconductor manufacturing process. The learned model generated by the learning unit 112 is provided to the inference device 120.

In the inference device 120, a data shaping program and an execution program are installed, and when the programs are executed, the inference device 120 functions as a data shaping unit 121 and an executing unit 122.

The data shaping unit 121 is an example of a processing unit and obtains non-processed image data (i.e., image data of an object to be processed) and parameter data (which will be described in detail later) transmitted from the simulation device 130. The data shaping unit 121 processes the obtained parameter data in a predetermined format suitable for being input to the learned model by the executing unit 122.

The executing unit 122 inputs the non-processed image data and the parameter data processed in the predetermined format by the data shaping unit 121 into the learned model to perform a simulation, so that the executing unit 122 outputs (or infers to obtain) processed image data (i.e., a simulation result).

In the simulation device 130, an execution program is installed, and when the program is executed, the simulation device 130 functions as an executing unit 131.

The executing unit 131 includes a simulator (i.e., a simulator based on what is called a physical model) that performs a simulation by setting parameter data indicating a predetermined processing condition to a physical model in which a semiconductor manufacturing process is identified using a physical law or the like. The executing unit 131 reads non-processed image data from a non-processed image data storage unit 132 and performs the simulation using the simulator based on the physical model, thereby outputting processed image data (i.e., a simulation result).

The non-processed image data read by the executing unit 131 includes image data representing a shape of an object (e.g., a wafer) to be processed in the semiconductor manufacturing process (e.g., dry etching, deposition, and the like). The object to be processed in the semiconductor manufacturing process is composed of multiple materials, and each pixel of the non-processed image data may be represented, for example, by a pixel value in accordance with a composition ratio (or a content ratio) of each material. However, the representation of the non-processed image data is not limited to this, and may be expressed in another representation.

The processed image data output by the executing unit 131 executing the simulation is image data representing a shape formed after dry etching when a dry etching simulator is used.

The processed image data output by the executing unit 131 executing the simulation is image data representing a shape formed after deposition processing when a deposition simulator is used.

The object processed by the semiconductor manufacturing process is also composed of multiple materials, and each pixel of the processed image data may be represented, for example, by a pixel value in accordance with a composition ratio (or a content ratio) of each material. However, the representation of the processed image data is not limited to this. Similarly with the non-processed image data, the image data may be represented in another representation.

The executing unit 131 generates training data including the non-processed image data used when the simulation is executed, the corresponding parameter data, and the processed image data, and transmits the generated training data to the learning device 110.

Further, the executing unit 131 transmits, to the inference device 120, the non-processed image data, the parameter data, and the processed image data that are to be used to verify the learned model by a user of the inference device 120.

The user of the inference device 120 verifies the learned model by contrasting the processed image data output by the executing unit 122 executing the simulation using the learned model with the processed image data transmitted from the executing unit 131.

Specifically, the user of the inference device 120 contrasts the following simulation time periods:
- a simulation time period from when the non-processed image data and the parameter data are input to the data shaping unit 121 to when the processed image data is output from the executing unit 122 in the inference device 120
- a simulation time period from when the non-processed image data is input to the executing unit 131 to when the processed image data is output from the executing unit 131 in a state in which the parameter data is set to the simulator based on the physical model in the simulation device 130

This enables the user of the inference device 120 to verify whether the simulation time period of the learned model is shorter than the simulation time period of the simulator based on the physical model.

The user of the inference device 120 contrasts the following data:
- the processed image data output from the executing unit 122 by inputting the non-processed image data and the parameter data to the data shaping unit 121 in the inference device 120
- the processed image data output from the executing unit 131 by inputting the non-processed image data to the executing unit 131 in a state in which the parameter data is set to the simulator based on the physical model in the simulation device 130

This enables the user of the inference device 120 to verify the simulation accuracy of the learned model for the simulator based on the physical model (i.e., whether the simulation accuracy of the learned model is sufficient to replace the simulator based on the physical model).

When the verification is completed, given non-processed image data and given parameter data are input to the inference device 120, and various simulations are performed.

<Hardware Configurations of Respective Devices Constituting the Simulation System>

Figure 2:
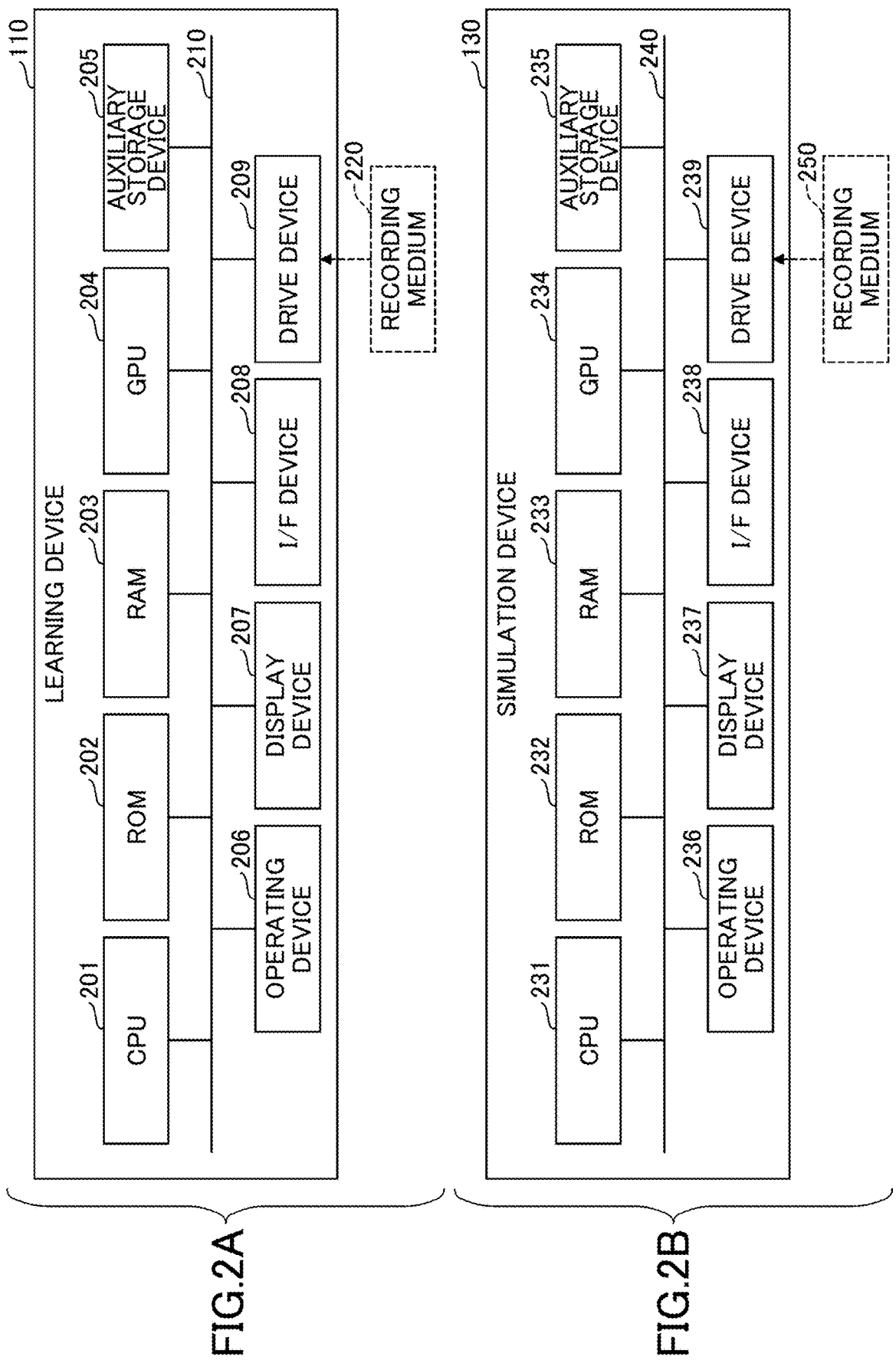
FIG. 2A and FIG. 2B are drawings illustrating examples of hardware configurations of respective devices constituting the simulation system.

Next, hardware configurations of respective devices (i.e., the learning device 110, the inference device 120, and the simulation device 130) constituting the simulation system 100 will be described with reference to FIG. 2A and FIG. 2B. FIG. 2A and FIG. 2B are drawings illustrating examples of the hardware configurations of the respective devices constituting the simulation system.

Since the hardware configuration of the learning device 110 is substantially the same as the hardware configuration of the inference device 120, the hardware configuration of the learning device 110 will be described here.

(1) Hardware Configuration of the Learning Device 110

FIG. 2A is a drawing illustrating an example of the hardware configuration of the learning device 110. As illustrated in FIG. 2A, the learning device 110 includes a central processing unit (CPU) 201 and a read only memory (ROM) 202. The learning device 110 also includes a random access memory (RAM) 203 and a graphics processing unit (GPU) 204. The processor (processing circuit or processing circuitry), such as the CPU 201 and the GPU 204, and the memory, such as the ROM 202 and the RAM 203, form what is called a computer.

The learning device 110 further includes an auxiliary storage device 205, an operating device 206, a display device 207, an interface (I/F) device 208, and a drive device 209. Each hardware component of the learning device 110 is interconnected to one another through a bus 210.

The CPU 201 is an arithmetic device that executes various programs (e.g., a data shaping program, a learning program, and the like) installed in the auxiliary storage device 205.

The ROM 202 is a non-volatile memory that functions as a main storage device. The ROM 202 stores various programs, data, and the like that are necessary for the CPU 201 to execute various programs installed in the auxiliary storage device 205. Specifically, the ROM 202 stores a boot program such as Basic Input/Output System (BIOS), Extensible Firmware Interface (EFI), or the like.

The RAM 203 is a volatile memory such as a dynamic random access memory (DRAM) or a static random access memory (SRAM) and functions as a main storage device. The RAM 203 provides a workspace in which various programs installed in the auxiliary storage device 205 are deployed when the various programs are executed by the CPU 201.

The GPU 204 is an arithmetic device for image processing. When various programs are executed by the CPU 201, the GPU 204 performs high-speed arithmetic operations on various image data by parallel processing.

The auxiliary storage device 205 is a storage unit that stores various programs, various image data on which image processing is performed by the GPU 204 when various programs are executed by the CPU 201, and the like. For example, the training data storage unit 113 is achieved by the auxiliary storage device 205.

The operating device 206 is an input device used when an administrator of the learning device 110 inputs various instructions to the learning device 110. The display device 207 is a display that displays internal information of the learning device 110.

The I/F device 208 is a connection device for connecting and communicating with another device (e.g., the simulation device 130).

The drive device 209 is a device in which a recording medium 220 is set. Here, the recording medium 220 includes a medium that records information optically, electrically, or magnetically, such as a CD-ROM, a flexible disk, a magneto-optical disk, or the like. The recording medium 220 may include a semiconductor memory that electrically records information, such as a ROM, a flash memory, or the like.

The various programs to be installed in the auxiliary storage device 205 are installed, for example, when the distributed recording medium 220 is set in the drive device 209 and various programs recorded in the recording medium 220 are read by the drive device 209. Alternatively, various programs to be installed in the auxiliary storage device 205 may be installed by downloading through a network, which is not illustrated.

(2) Hardware Configuration of the Simulation Device 130

FIG. 2B is a drawing illustrating an example of the hardware configuration of the simulation device 130. As illustrated in FIG. 2B, since the hardware configuration of the simulation device 130 is substantially the same as that of the learning device 110, the description will be omitted here.

<Description of the Training Data>

Figure 3:
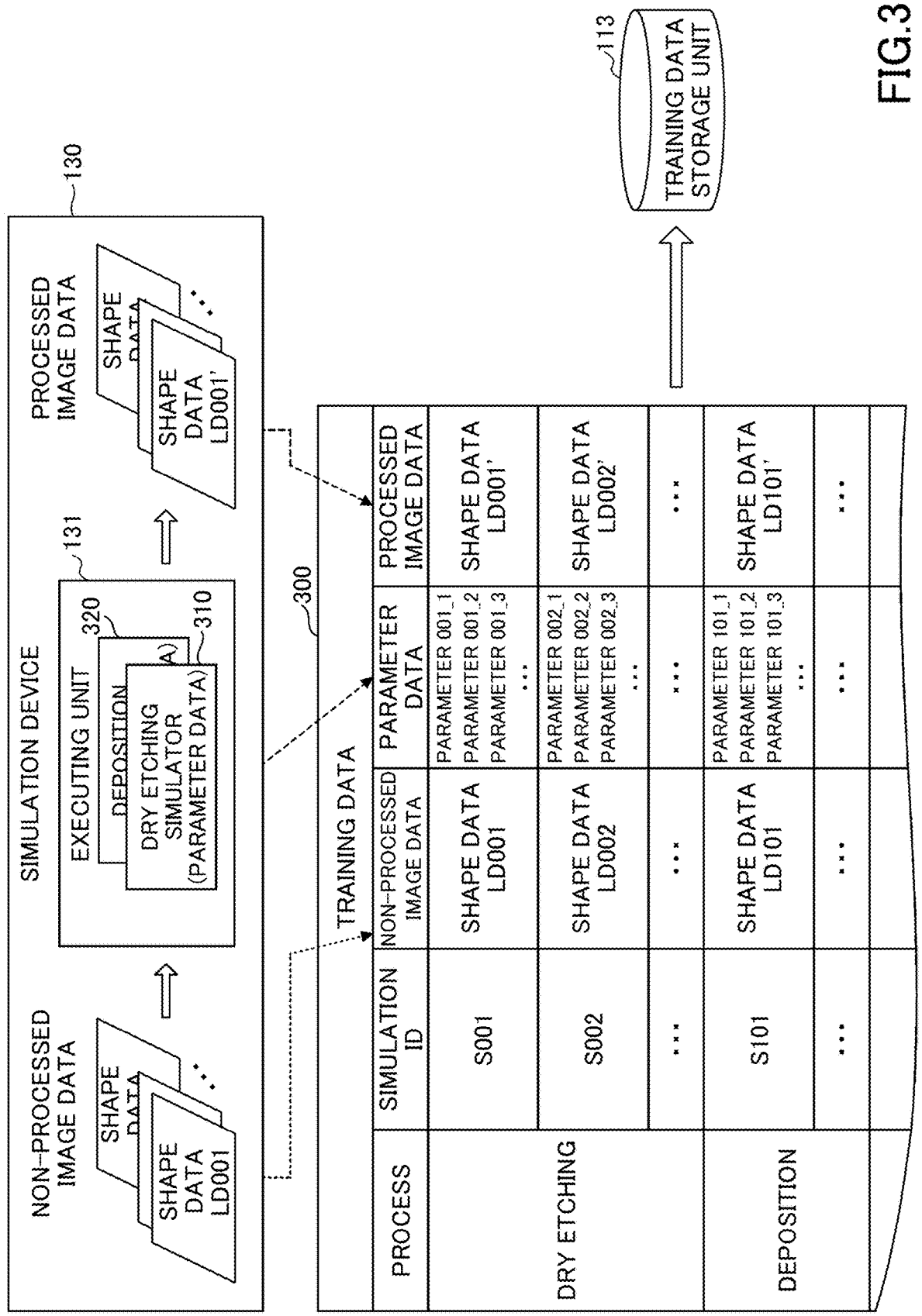
FIG. 3 is a drawing illustrating an example of training data.

Next, the training data transmitted from the simulation device 130 and stored in the training data storage unit 113 will be described. FIG. 3 is a drawing illustrating an example of the training data. As illustrated in FIG. 3, the training data 300 includes "process", "simulation ID", "non-processed image data", "parameter data", and "processed image data" as items of information.

In the "process", a name indicating the semiconductor manufacturing process is stored. The example of FIG. 3 indicates a state in which two names "dry etching" and "deposition" are stored as the "process".

In the "simulation ID", an identifier for identifying each simulation executed by the executing unit 131 using each simulator is stored. In a first embodiment, the executing unit 131 includes a dry etching simulator 310 and a deposition simulator 320, and performs the simulation by using each of the simulators.

The example of FIG. 3 indicates a state in which "S001" and "S002" are stored as the "simulation ID" of the simulation executed by the executing unit 131 using the dry etching simulator 310. The example of FIG. 3 indicates a state in which "S101" is stored as the "simulation ID" of the simulation executed by the executing unit 131 using the deposition simulator 320.

In the "non-processed image data", a file name of the non-processed image data that is input by the executing unit 131 when the simulation is executed using each simulator is stored. The example of FIG. 3 illustrates that if the simulation ID is S001, the simulation is executed by inputting the non-processed image data having "shape data LD001" as the "file name" into the dry etching simulator 310. The example of FIG. 3 illustrates that if the simulation ID is S002, the simulation is executed by inputting the non-processed image data having "shape data LD002" as the "file name" into the dry etching simulator 310. Further, the example of FIG. 3 illustrates that if the simulation ID is S101, the simulation is executed by inputting the non-processed image data having "shape data LD101" as the "file name" into the deposition simulator 320.

In the "parameter data", information representing a predetermined processing condition set to each simulator when the executing unit 131 executes the simulation is stored. The example of FIG. 3 illustrates that "parameters 001_1", "parameters 001_2", and so on have been set by the executing unit 131 when the simulation whose simulation ID is S001 is performed using the dry etching simulator 310.

Here, "Parameter 001_1", "Parameter 001_2", and so on indicate the following values:
 etch ratio of each material
 etch lateral ratio of each material
 etch depth of each material In the "processed image data", the file name of the processed image data output by the executing unit 131 performing the simulation using each simulator is stored. The example of FIG. 3 illustrates that if the simulation ID is S001, when the simulation has been performed using the dry etching simulator 310, the processed image data having "shape data LD001'" as the "file name" is output.

The example of FIG. 3 illustrates that if the simulation ID is S002, when the simulation has been performed using the dry etching simulator 310, the processed image data having "shape data LD002'" as the "file name" is output.

Further, the example of FIG. 3 illustrates that if the simulation ID is S101, when the simulation has been performed using the deposition simulator 320, the processed image data having "shape data LD101'" as the "file name" is output.

The executing unit 131 performs the simulation by using each simulator to generate the training data 300 and transmit the training data 300 to the learning device 110. Then, the training data 300 is stored in the training data storage unit 113 of the learning device 110.

<Functional Configuration of the Learning Device>

Next, functional configurations of respective units (i.e., the data shaping unit 111 and the learning unit 112) of the learning device 110 will be described in detail.

(1) Details of the Functional Configuration of the Learning Unit

Figure 4:
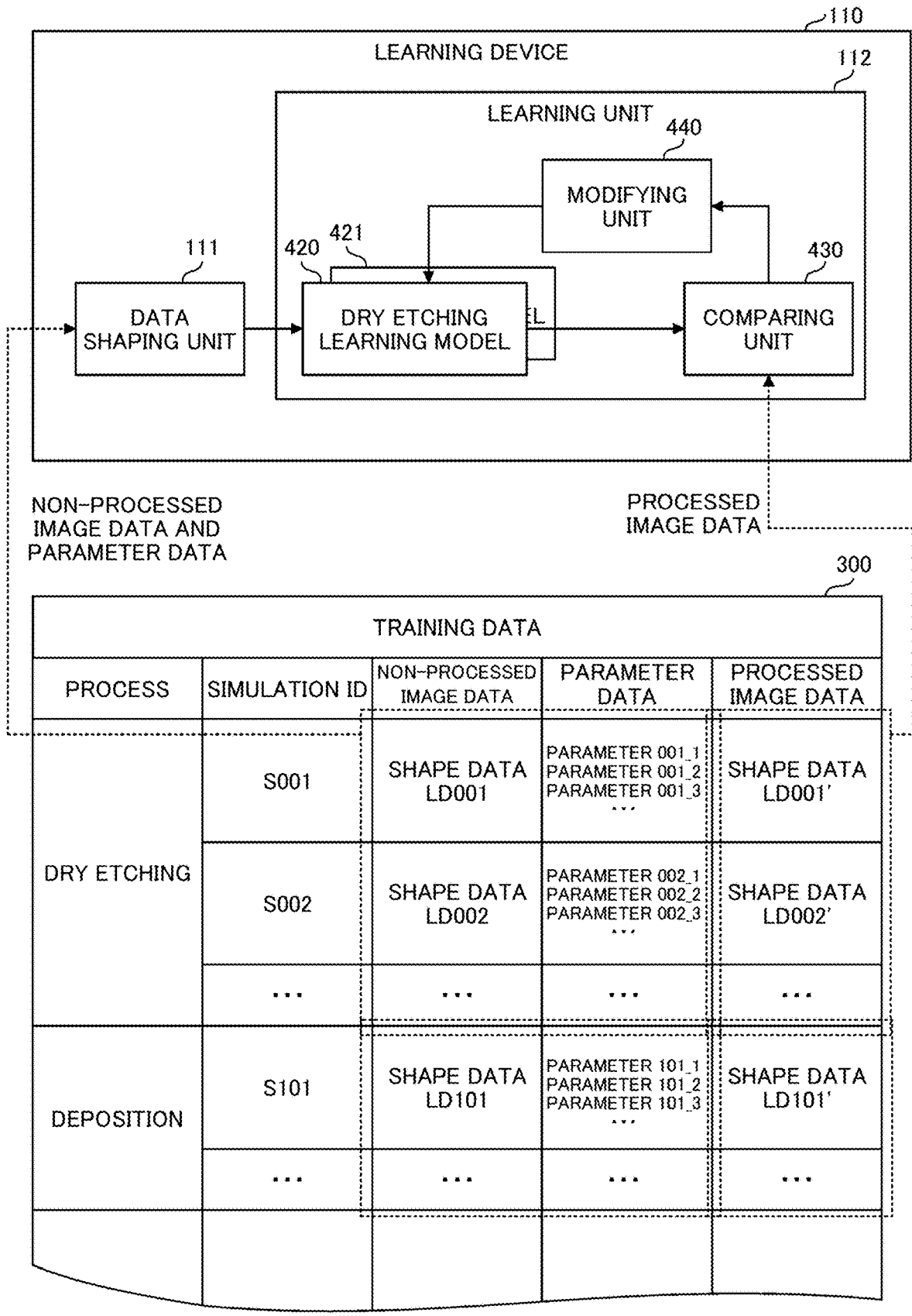
FIG. 4 is a drawing illustrating an example of a functional configuration of a learning unit of a learning device according to a first embodiment.

First, the functional configuration of the learning unit 112 of the learning device 110 will be described in detail. FIG. 4 is a drawing illustrating an example of the functional configuration of the learning unit of the learning device according to the first embodiment. As illustrated in FIG. 4, the learning unit 112 of the learning device 110 includes a dry etching learning model 420, a deposition learning model 421, a comparing unit 430, and a modifying unit 440.

The non-processed image data and the parameter data of the training data 300 stored in the training data storage unit 113 are read by the data shaping unit 111 and are input to a corresponding learning model. In the present embodiment, the parameter data is processed into a predetermined format by the data shaping unit 111 and is input to the corresponding learning model. However, data that has been processed into the predetermined format may be read by the data shaping unit 111 and may be input to the corresponding learning model.

Into the dry etching learning model 420, the non-processed image data and the parameter data processed into the predetermined format by the data shaping unit 111 (which are limited to the non-processed image data and the parameter to which the "dry etching" of the "process" is associated) are input. When the non-processed image data and the parameter data processed into the predetermined format are input, the dry etching learning model 420 outputs an output result. The dry etching learning model 420 inputs the output result to the comparing unit 430.

Similarly, into the deposition learning model 421, the non-processed image data and the parameter data processed into the predetermined format by the data shaping unit 111 (which are limited to the non-processed image data and the parameter data to which the "deposition" of the "process" is associated) are input. When the non-processed image data and the parameter data processed in the predetermined format are input, the deposition learning model 421 outputs an output result. The deposition learning model 421 inputs the output result to the comparing unit 430.

The comparing unit 430 compares the output result output from the dry etching learning model 420 with the processed image data of the training data 300 (i.e., the processed image data to which "dry etching" of the "process" is associated) and notifies the modifying unit 440 of differential information.

Similarly, the comparing unit 430 compares the output result output from the deposition learning model 421 with the processed image data of the training data 300 (i.e., the processed image data to which the "deposition" of the "process" is associated) and notifies the modifying unit 440 of differential information.

The modifying unit 440 updates a model parameter of the dry etching learning model 420 or the deposition learning model 421 based on the differential information notified by the comparing unit 430. The differential information used to update the model parameter may be a squared error or an absolute error.

As described above, the learning unit 112 inputs the non-processed image data and the parameter data processed in the predetermined format into the learning model and updates the model parameter by using machine learning so that the output result output from the learning model approaches the processed image data.

(2) Details of the Functional Configuration of the Data Shaping Unit

Figure 5:
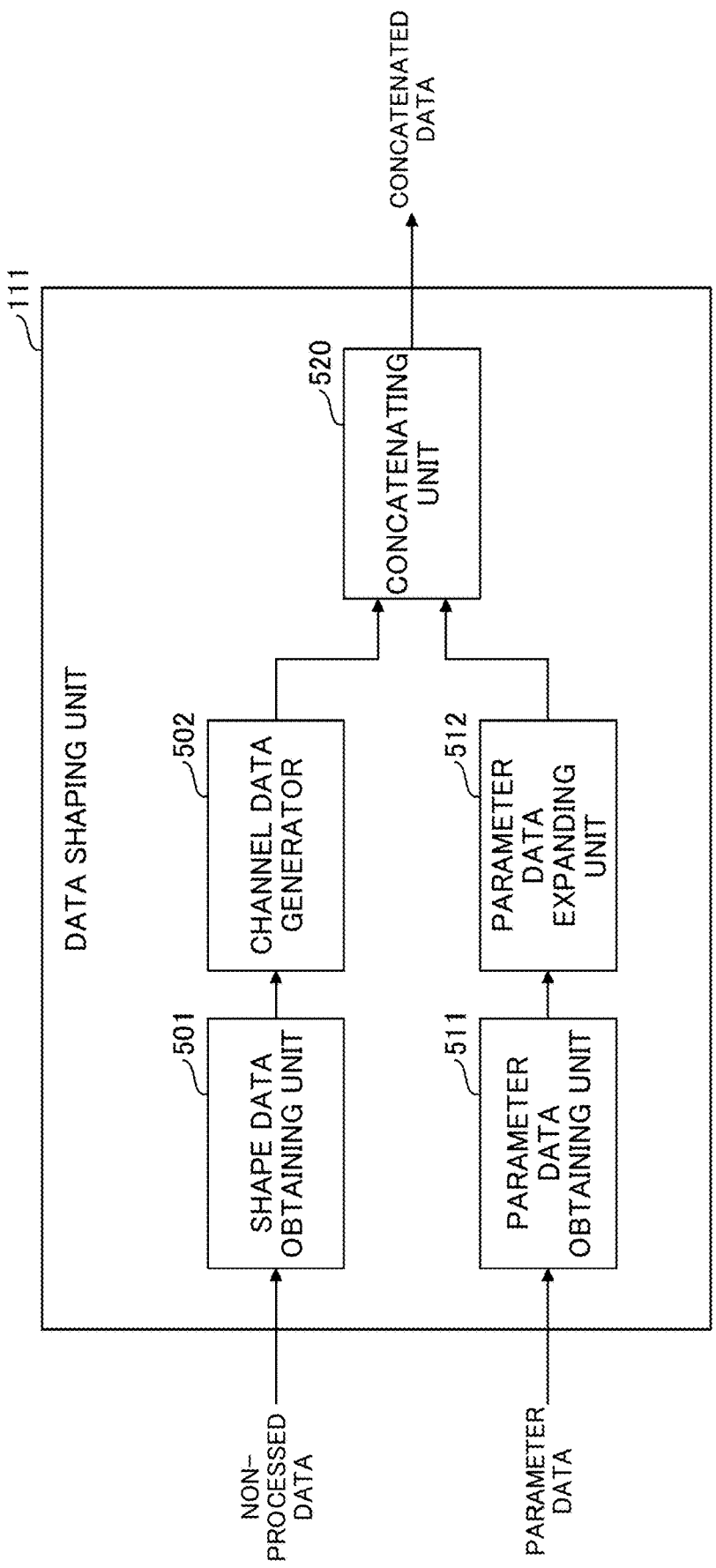
FIG. 5 is a drawing illustrating an example of a functional configuration of a data shaping unit of the learning device according to the first embodiment.

Next, the functional configuration of the data shaping unit 111 of the learning device 110 will be described in detail. FIG. 5 is a drawing illustrating an example of the functional configuration of the data shaping unit of the learning device according to the first embodiment. As illustrated in FIG. 5, the data shaping unit 111 includes a shape data obtaining unit 501, a channel data generator 502, a parameter data obtaining unit 511, a parameter data expanding unit 512, and a concatenating unit 520.

The shape data obtaining unit 501 reads the processed image data of the training data 300 from the training data storage unit 113 and notifies the channel data generator 502.

The channel data generator 502 is an example of a generator. The channel data generator 502 obtains the non-processed image data notified by the shape data obtaining unit 501 (here, it is assumed that the image data is represented by pixel values in accordance with the composition ratio (or the content ratio) of each material). The channel data generator 502 generates image data having multiple channels corresponding to types of the materials from the obtained non-processed image data. Hereinafter, the image data having the channels corresponding to the types of the materials is called channel data. For example, the channel data generator 502 generates channel data including an air layer and four channel data respectively including four material layers from the non-processed image data.

The channel data generator 502 notifies the concatenating unit 520 of the generated multiple channel data. In the present embodiment, although the channel data generator 502 generates the channel data, the channel data may be previously generated. In this case, the channel data generator 502 reads the previously generated channel data and notifies the concatenating unit 520.

The parameter data obtaining unit 511 reads the parameter data of the training data 300 from the training data storage unit 113 and notifies the parameter data expanding unit 512.

The parameter data expanding unit 512 processes the parameter data notified from the parameter data obtaining unit 511 into a predetermined format in accordance with the size of the non-processed image data (i.e., a format of a two-dimensional array in accordance with the width and the height of the non-processed image data).

Here, in the parameter data, numerical values of parameters such as "parameter 001_1", "parameter 001_2", "parameter 001_3", and so on are arranged in one dimension. Specifically, in the parameter data, numerical values of N types of parameters are arranged in one dimension.

Thus, the parameter data expanding unit 512 extracts a numerical value of one of the N types of parameters included in the parameter data one by one, and arranges the extracted numerical values in two dimensions in accordance with the width and the height of the non-processed image data. As a result, the parameter data expanding unit 512 generates N parameter data respectively arranged in two dimensions.

The parameter data expanding unit 512 notifies the concatenating unit 520 of the N parameter data respectively arranged in two dimensions.

The concatenating unit 520 concatenates the N parameter data respectively arranged in two dimensions that is notified from the parameter data expanding unit 512 with the multiple channel data notified from the channel data generator 502 as new channels to generate concatenated data. In the present embodiment, the concatenating unit 520 generates the concatenated data, but the concatenated data may have been previously generated. In this case, the concatenating unit 520 reads the previously generated concatenated data and inputs the concatenated data into the learning model.

<Specific Example of a Process Performed by Each Unit of the Learning Device>

Next, specific examples of a process performed by the above-described data shaping unit 111 and a process performed by the dry etching learning model 420 in the learning unit 112 among the respective units of the learning device 110 will be described.

(1) Specific Example of the Process Performed by the Data Shaping Unit

Figure 6:
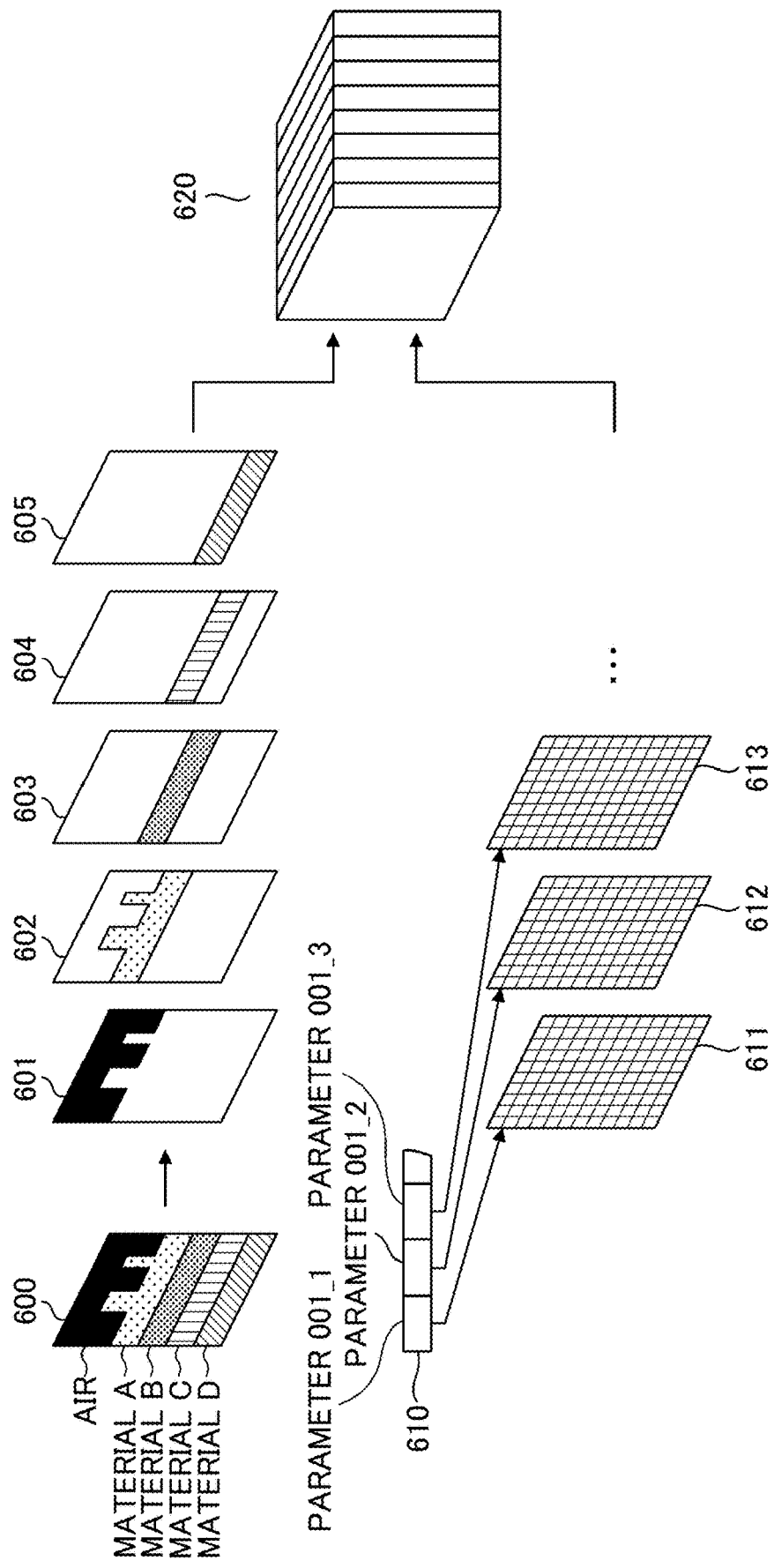
FIG. 6 is a drawing illustrating a specific example of a process performed by the data shaping unit of the learning device according to the first embodiment.

FIG. 6 is a drawing illustrating a specific example of the process performed by the data shaping unit. In FIG. 6, the non-processed image data 600 is, for example, non-processed image data having "shape data LD001" as the "file name".

As illustrated in FIG. 6, the non-processed image data 600 includes a layer of air, a layer of a material A, a layer of a material B, a layer of a material C, and a layer of a material D. In this case, the channel data generator 502 generates channel data 601, 602, 603, 604, and 605.

As illustrated in FIG. 6, in parameter data 610, numerical values of respective parameters (e.g., "parameter 001_1", "parameter 001_2", "parameter 001_3", and so on) are arrayed in one dimension.

In this case, the parameter data expanding unit 512 arrays the parameter 001_1 in two dimensions (i.e., the parameter data expanding unit 512 arrays the same values vertically and horizontally) in accordance with the width and the height of the non-processed image data 600. Similarly, the parameter data expanding unit 512 arrays the parameter 001_2 in two dimensions in accordance with the width and the height of the non-processed image data 600. Similarly, the parameter data expanding unit 512 arrays the parameter 001_3 in two dimensions in accordance with the width and the height of the non-processed image data 600.

Parameter data 611, 612, 613, and so on respectively arrayed in two dimensions are concatenated by the concatenating unit 520 as new channels with the channel data 601, 602, 603, 604, and 605, and concatenated data 620 is generated.

Figure 7:
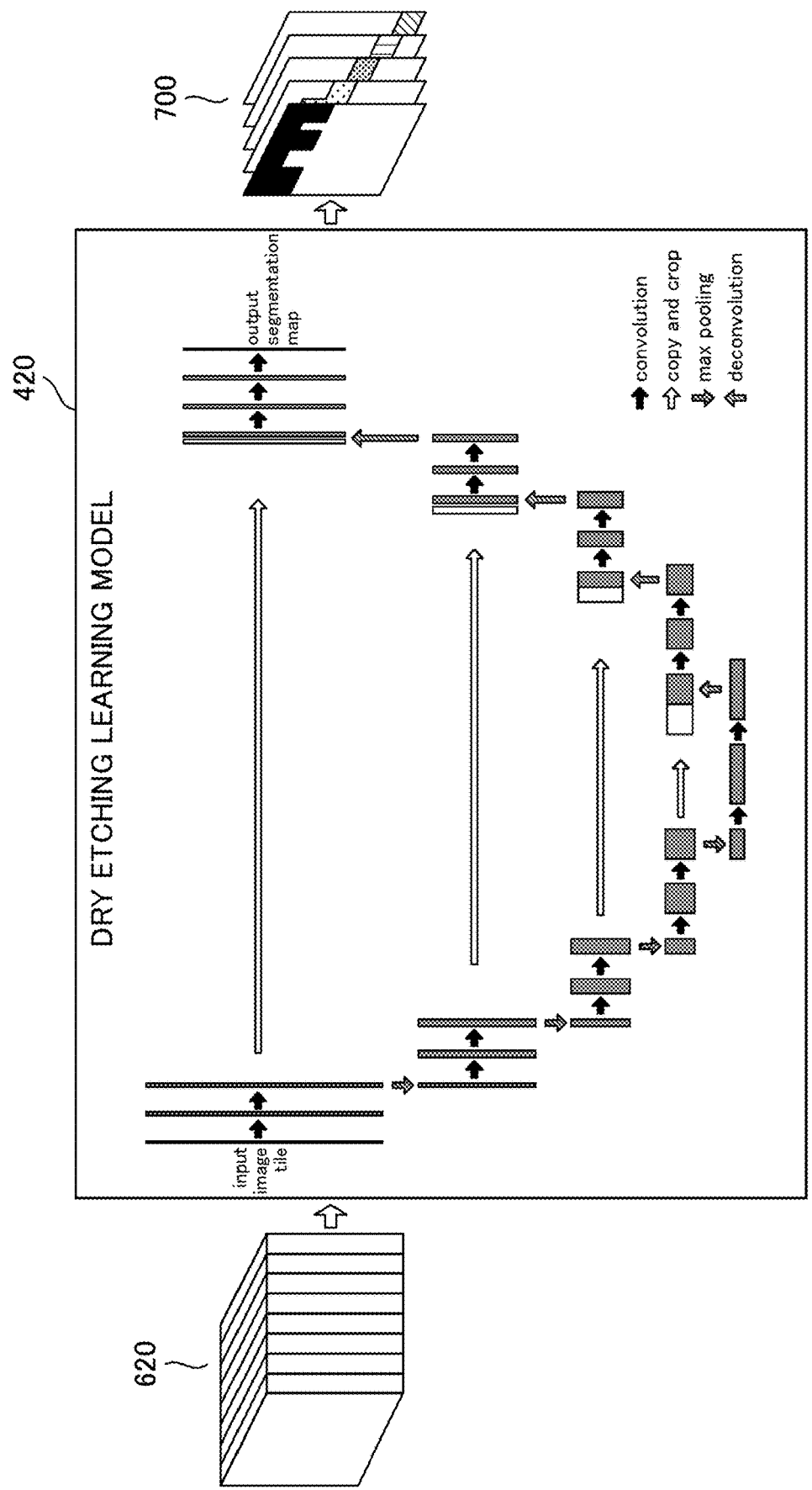
FIG. 7 is a drawing illustrating a specific example of a process performed by a dry etching learning model of the learning device according to the first embodiment.

(2) Specific Example of a Process Performed Using the Dry Etching Learning Model Next, a specific example of a process performed using the dry etching learning model 420 in the learning unit 112 will be described. FIG. 7 is a drawing illustrating a specific example of the process performed using the dry etching learning model of the learning device according to the first embodiment. As illustrated in FIG. 7, in the present embodiment, a learning model based on a U-shaped convolutional neural network (CNN) (which is what is called UNET) is used as the dry etching learning model 420.

When the UNET is used, typically, image data is input and image data is output. Thus, the UNET is used as a learning model of the learning unit 112, so that non-processed image data of the semiconductor manufacturing process can be input and the processed image data of the semiconductor manufacturing process can be output.

With respect to the above, when the UNET is used, data that is not in an image data format is required to be processed into an image data format. The parameter data expanding unit 512 of the data shaping unit 111 described above is configured to array the parameter data in two dimensions in order to process the data to be input to the UNET into an image data format. The parameter data can be input, so that simulation contents achieved in the simulator based on the physical model can be also achieved in the UNET.

The example of FIG. 7 illustrates a state in which the concatenated data 620 is input to the dry etching learning model 420 using the UNET, and an output result 700 including multiple channel data is output.

Here, in the example of FIG. 7, a specific example of the process performed by using the dry etching learning model 420 is illustrated. However, a specific example of the process performed by using the deposition learning model 421 is substantially the same.

<Flow of a Learning Process in the Simulation System>

Next, a flow of a learning process in the simulation system 100 will be described. FIG. 8 is a flowchart illustrating the flow of the learning process in the simulation system.

In step S801, the executing unit 131 of the simulation device 130 sets parameter data to the dry etching simulator 310 or the deposition simulator 320 based on an instruction of the administrator of the simulation device 130.

In step S802, the executing unit 131 of the simulation device 130 reads the non-processed image data from the non-processed image data storage unit 132. The executing unit 131 performs the simulation (i.e., the executing unit 131 generates the processed image data) by using the dry etching simulator 310 or the deposition simulator 320.

In step S803, the executing unit 131 of the simulation device 130 generates the training data and transmits the training data to the learning device 110. The training data generated by the executing unit 131 includes parameter data set when the simulation is executed, the non-processed image data input when the simulation is executed, and the processed image data generated when the simulation is executed.

In step S804, the data shaping unit 111 of the learning device 110 generates the concatenated data based on the non-processed image data and the parameter data included in the training data.

In step S805, the learning unit 112 of the learning device 110 performs machine learning on the learning model by using the concatenated data as an input and the processed image data as an output, to generate the learned model.

In step S806, the learning unit 112 of the learning device 110 transmits the generated learned model to the inference device 120.

<Functional Configuration of the Inference Device>

Next, a functional configuration of the inference device 120 will be described in detail. In respective units of the inference device 120 (i.e., the data shaping unit 121 and the executing unit 122), the details of the functional configuration of the data shaping unit 121 are the same as the details of the functional configuration of the data shaping unit 111 of the learning device 110. Thus, details of the functional configuration of the data shaping unit 121 will be omitted here, and details of the functional configuration of the executing unit 122 will be described below.

FIG. 9 is a drawing illustrating an example of the functional configuration of the executing unit of the inference device. As illustrated in FIG. 9, the executing unit 122 of the inference device 120 includes a dry etching learned model 920, a deposition learned model 921, and an output unit 930.

When the non-processed image data that is not used as the training data 300 is transmitted to the inference device 120 together with the parameter data from the simulation device 130, for example, the data shaping unit 121 generates concatenated data and inputs the concatenated data to each learned model in the executing unit 122. The example of FIG. 9 illustrates a state in which non-processed image data having "shape data SD001", "shape data SD002", . . . , so on as the "file name" is transmitted to the inference device 120 as the non-processed image data that is not used as the training data 300.

As illustrated in FIG. 9, the non-processed image data (e.g., the images having "shape data SD001", "shape data SD002", . . . , and so on as the "file name") is also input to the executing unit 131 in parallel. Then, the executing unit 131 performs the simulation by using each simulator and outputs the processed image data (e.g., the images having "shape data SD001'", "shape data SD002'", . . . , and so on as the "file name").

The dry etching learned model 920 performs the simulation in response to the concatenated data generated by the data shaping unit 121 being input. The dry etching learned model 920 notifies the output unit 930 of an output result that is output by performing the simulation.

Similarly, the deposition learned model 921 performs the simulation in response to the concatenated data generated by the data shaping unit 121 being input. The deposition learned model 921 notifies the output unit 930 of an output result that is output by performing the simulation.

The output unit 930 generates processed image data (e.g., image data having "shape data SD001''" as the "file name") from the output result notified from the dry etching learned model 920 and outputs the processed image data as a simulation result. Similarly, the output unit 930 generates processed image data (e.g., image data having "shape data SD101''" as the "file name") from the output result notified from the deposition learned model 921, and outputs the processed image data as a simulation result.

Here, the user of the inference device 120 can verify the simulation time period of the inference device 120 by comparing a period until the processed image data is output from the output unit 930 and a period until the processed image data is output from the executing unit 131. The user of the inference device 120 can verify the simulation accuracy of the inference device 120 by contrasting the processed image data output from the output unit 930 and the processed image data output from the executing unit 131.

According to the first embodiment, the simulation time period of each learned model in the executing unit 122 is shorter than the simulation time period of the corresponding simulator in the executing unit 131. This is because, in a case of the simulation based on each learned model, there is no need to repeat trials while, in a case of the simulation based on each simulator, there is need to repeat trials, and high-speed computing can be performed by parallel processing of the GPU 204.

Further, according to the first embodiment, each learned model in the executing unit 122 can achieve the simulation accuracy that is sufficient to replace the corresponding simulator in the executing unit 131. This is because machine learning has been performed on each learned model by using non-processed image data input to the corresponding simulator and processed image data output from the corresponding simulator.

Figure 10A:
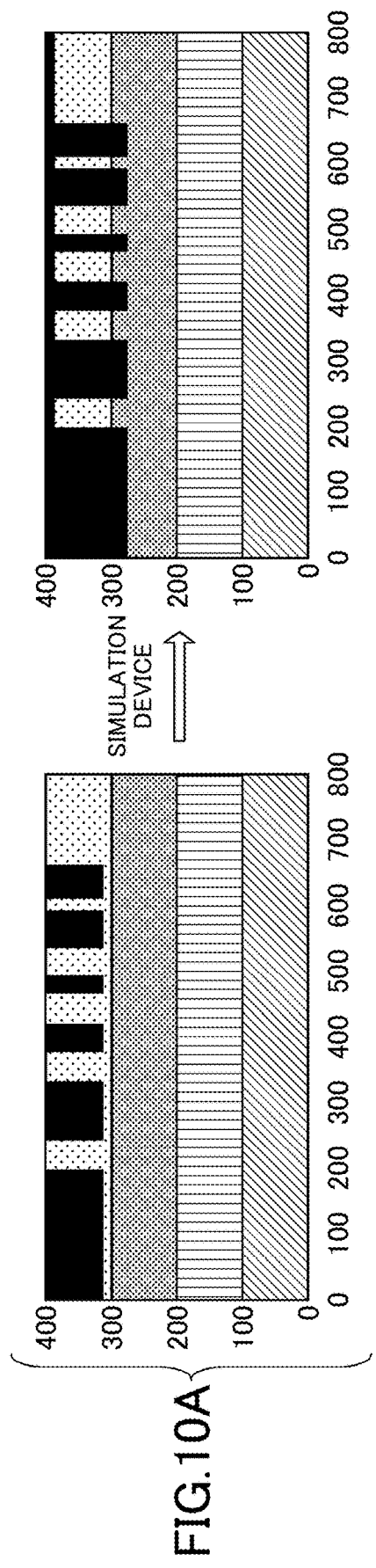
FIG. 10A and FIG. 10B are drawings illustrating the simulation accuracy of a dry etching learned model.
Figure 10B:
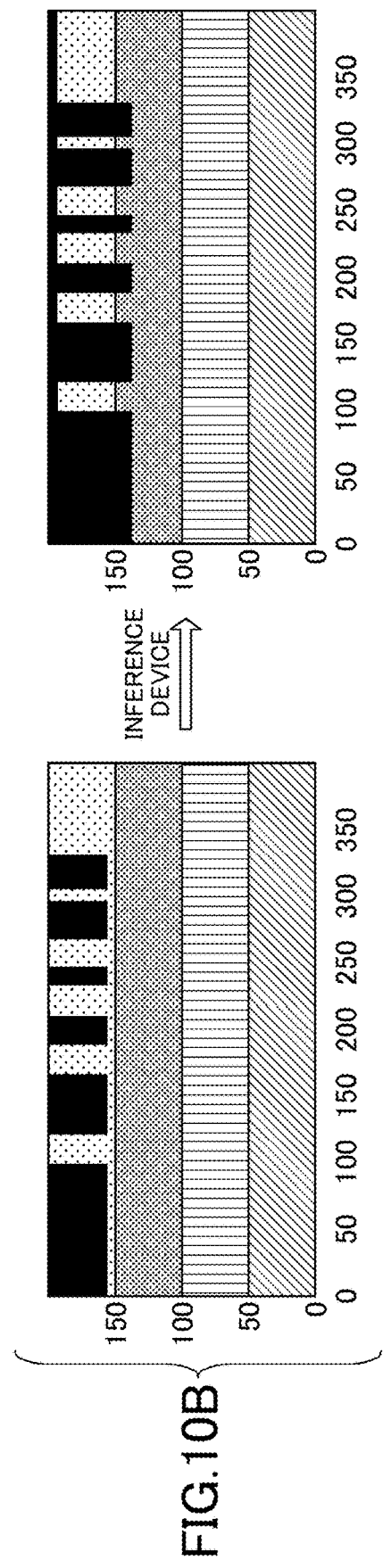

FIG. 10A and FIG. 10B are drawings illustrating the simulation accuracy of the dry etching learned model. FIG. 10A illustrates the non-processed image data and the processed image data when the simulation is performed by using the dry etching simulator 310 of the simulation device 130 as a comparison target.

With respect to the above, FIG. 10B illustrates the non-processed image data and the processed image data when the simulation is performed by using the dry etching learned model 920 in the inference device 120.

When the processed image data of FIG. 10A is contrasted with the processed image data of FIG. 10B, there is no difference between them. Thus, the dry etching learned model 920 can be considered to have the simulation accuracy that is sufficient to replace the dry etching simulator 310.

Similarly, FIG. 11A and FIG. 11B are drawings illustrating the simulation accuracy of the deposition learned model. FIG. 11A illustrates the non-processed image data and the processed image data when the simulation is performed by using the deposition simulator 320 in the simulation device 130 as a comparison target.

With respect to the above, FIG. 11B illustrates the non-processed image data and the processed image data when the simulation is performed by using the deposition learned model 921 in the inference device 120.

When the processed image data of FIG. 11A is contrasted with the processed image data of FIG. 11B, there is no difference between them. Thus, it can be considered that the deposition learned model 921 has the simulation accuracy that is sufficient to replace the deposition simulator 320.

<Summary>

As is clear from the above description, the learning device according to the first embodiment is configured to:
- obtain the non-processed image data that is input to the simulator based on the physical model and the parameter data that is set in the simulator based on the physical model
- array the obtained parameter data in two dimensions in accordance with the width and the height of the obtained non-processed image data to process the obtained parameter data into an image data format, and concatenate the processed parameter data with the non-processed image to generate concatenated data
- perform machine learning by inputting the generated concatenated data into a learning model based on a U-shaped convolutional neural network so that an output result output from the learning model approaches the processed image data output from the simulator based on the physical model This enables the learning device according to the first embodiment to generate a learned model that achieves simulation contents achieved in the simulator based on the physical model.

Further, this enables the learning device according to the first embodiment to generate a learned model that can reduce a simulation time period to be shorter than a simulation time period of the simulator based on the physical model. The learning device according to the first embodiment can generate a learned model having the simulation accuracy that is sufficient to replace the simulator based on the physical model.

Here, in the above description, the simulator based on the physical model is targeted. However, it is needless to say that even if the simulator is not based on the physical model, the learning device according to the first embodiment can similarly generate a learned model.

The inference device according to the first embodiment is configured to:
- obtain the non-processed image data and the corresponding parameter data
- array the obtained parameter data in two dimensions in accordance with the width and the height of the obtained non-processed image data to process the obtained parameter data into an image data format, and concatenate the processed parameter data with the non-processed image to generate concatenated data
- perform simulation by inputting the generated concatenated data into the learned model generated by the learning device This enables the inference device according to the first embodiment to achieve simulation contents achieved in the simulator based on the physical model. Further, this enables the inference device according to the first embodiment to reduce the simulation time period in comparison with the simulator based on the physical model, and to achieve the simulation accuracy that is sufficient to replace the simulator based on the physical model.

Here, in the above description, the simulator based on the physical model is targeted. However, it is needless to say that even if the simulator is not based on the physical model, the inference device according to the first embodiment can similarly achieve the simulation contents and the simulation accuracy.

As described above, according to the first embodiment, a learned model that replaces the simulator of the semiconductor manufacturing process can be provided.

Second Embodiment

In the above-described first embodiment, the parameter data is processed into the image data format in accordance with the width and the height of the non-processed image data, and is concatenated with the non-processed image data to be input to a learning model (or a learned model).

However, a method of processing the parameter data and a method of inputting the processed parameter data into a learning model (or a learned model) are not limited to this. For example, the processed parameter data may be input to each layer of a learning model (or a learned model). When the parameter data is input to each layer of the learning model (or learned model), the parameter data may also be processed into a predetermined format used when the image data on which a convolution operation is performed at each layer of the learning model (or the learned model) is converted. In the following, a second embodiment will be described focusing on differences between the second embodiment and the above-described first embodiment.

<Functional Configuration of a Data Shaping Unit>

First, a functional configuration of a data shaping unit of the learning device according to the second embodiment will be described in detail. FIG. 12 is a drawing illustrating an example of the functional configuration of the data shaping unit of the learning device according to the second embodiment. A difference between this functional configuration and the functional configuration of the data shaping unit 111 illustrated in FIG. 5 is that a data shaping unit 1200 illustrated in FIG. 12 includes a concatenating unit 1201 and a normalizing unit 1202.

The concatenating unit 1201 concatenates multiple channel data notified from the channel data generator 502 and generates concatenated data.

The normalizing unit 1202 normalizes the parameter data notified from the parameter data obtaining unit 511 and generates normalized parameter data.

<Specific Example of a Process Performed by a Learning Model>

Figure 13:
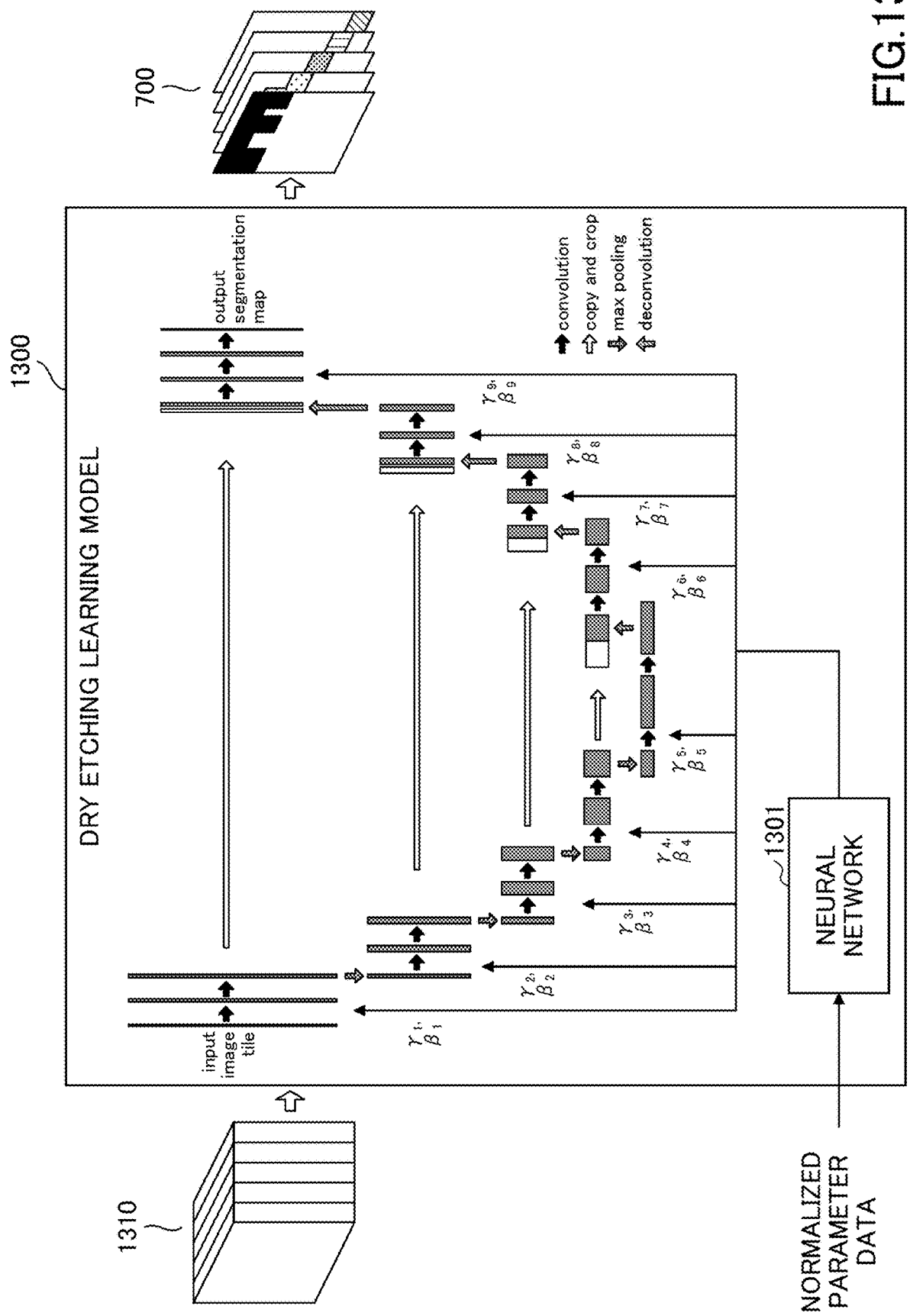
FIG. 13 is a drawing illustrating a specific example of a process performed by a dry etching learning model of the learning device according to the second embodiment.

Next, a specific example of a process performed by a dry etching learning model will be described. FIG. 13 is a drawing illustrating the specific example of the process performed by the dry etching learning model of the learning device according to the second embodiment.

As illustrated in FIG. 13, in the learning device according to the second embodiment, concatenated data 1310 generated by the concatenating unit 1201 of the data shaping unit 1200 is input to a dry etching learning model 1300.

As illustrated in FIG. 13, in the learning device according to the second embodiment, the normalized parameter data generated by the normalizing unit 1202 of the data shaping unit 1200 is input to the dry etching learning model 1300.

As illustrated in FIG. 13, the dry etching learning model 1300 includes a neural network 1301 that is a fully connected learning model in addition to the UNET that is a CNN-based learning model.

In response to the normalized parameter data being input, the neural network 1301 outputs predetermined format values (e.g., coefficients $\gamma$ and $\beta$ of a linear equation) used to convert a value of each pixel of each image data on which a convolution operation is performed at each layer of the UNET. That is, the neural network 1301 has a function to process the normalized parameter data into a predetermined format (e.g., a format of coefficients of a linear equation).

In the example of FIG. 13, the UNET is composed of nine layers, so that the neural network 1301 outputs $(\gamma 1, \beta 1)$ to $(\gamma 9, \beta 9)$ as coefficients of the linear equation. In the example illustrated in FIG. 13, due to space limitation, a pair of the coefficients of the linear equation is input for each layer, but multiple pairs of the coefficients of the linear equation are input for each layer for each channel data.

In each layer of the UNET, a value of each pixel of image data of each channel data (which is defined as "h" here) on which a convolution operation is performed is converted by using, for example, a linear equation: $h \times y + \beta$ (i.e., in the first layer, $h \times \gamma_1 + \beta_1$).

Here, the coefficients $(\gamma 1, \beta 1)$ to $(\gamma 9, \beta 9)$ of the linear equation can be regarded as an index indicating which image data is important among image data of respective channel data on which a convolution operation is performed in each layer of the UNET, for example. That is, the neural network 1301 performs a process of calculating an index indicating the importance of each image data processed at each layer of the learning model based on the normalized parameter data.

Under the above-described configuration, when the concatenated data 1310 and the normalized parameter data are input to the dry etching learning model 1300, the output result 700 including multiple channel data is output. The output result 700 is compared with the processed image data by the comparing unit 430 and differential information is calculated. In the learning device according to the second embodiment, the modifying unit 440 updates model parameters of the UNET and model parameters of the neural network 1301 in the dry etching learning model 1300 based on the differential information.

As described above, the learning device according to the second embodiment can extract highly important image data in each layer of the UNET based on the normalized parameter data when machine learning is performed on the dry etching learning model 1300.

<Summary>

As is clear from the above description, the learning device according to the second embodiment is configured to:

obtain the non-processed image data input to the simulator based on the physical model and the parameter data set in the simulator based on the physical model normalize the obtained parameter data to process the obtained parameter data into a coefficient format of a linear equation used to convert a value of each pixel of each image data on which a convolution operation is performed in each layer of the learning model convert the value of each pixel of each image data on which a convolution operation is performed in each layer by using the linear equation when the learning unit performs machine learning This enables the learning device according to the second embodiment to generate a learned model that achieves the simulation contents achieved in the simulator based on the physical model.

Additionally, the learning device according to the second embodiment can generate a learned model that can reduce the simulation time period in comparison with the simulator based on the physical model. Further, the learning device according to the second embodiment can generate a learned model that has the simulation accuracy sufficient to replace the simulator based on the physical model.

Although the learning device has been described in the second embodiment, when the executing unit performs the simulation in the inference device, substantially the same process is performed.

Thus, according to the second embodiment, in the simulation of the semiconductor manufacturing process, a learned model that replaces the simulator based on the physical model can be provided.

Third Embodiment

In the first and second embodiments described above, when the learning unit performs machine learning, events specific to the semiconductor manufacturing process are not particularly mentioned. However, events specific to the semiconductor manufacturing process exist, and the simulation accuracy can be further improved by reflecting a specific event in machine learning performed by the learning unit (i.e., by reflecting domain knowledge in machine learning performed by the learning unit). In the following, a third embodiment in which domain knowledge is reflected will be described focusing on differences between the third embodiment and the first and second embodiments described above.

<Details of a Functional Configuration of the Learning Model>

Figure 14:
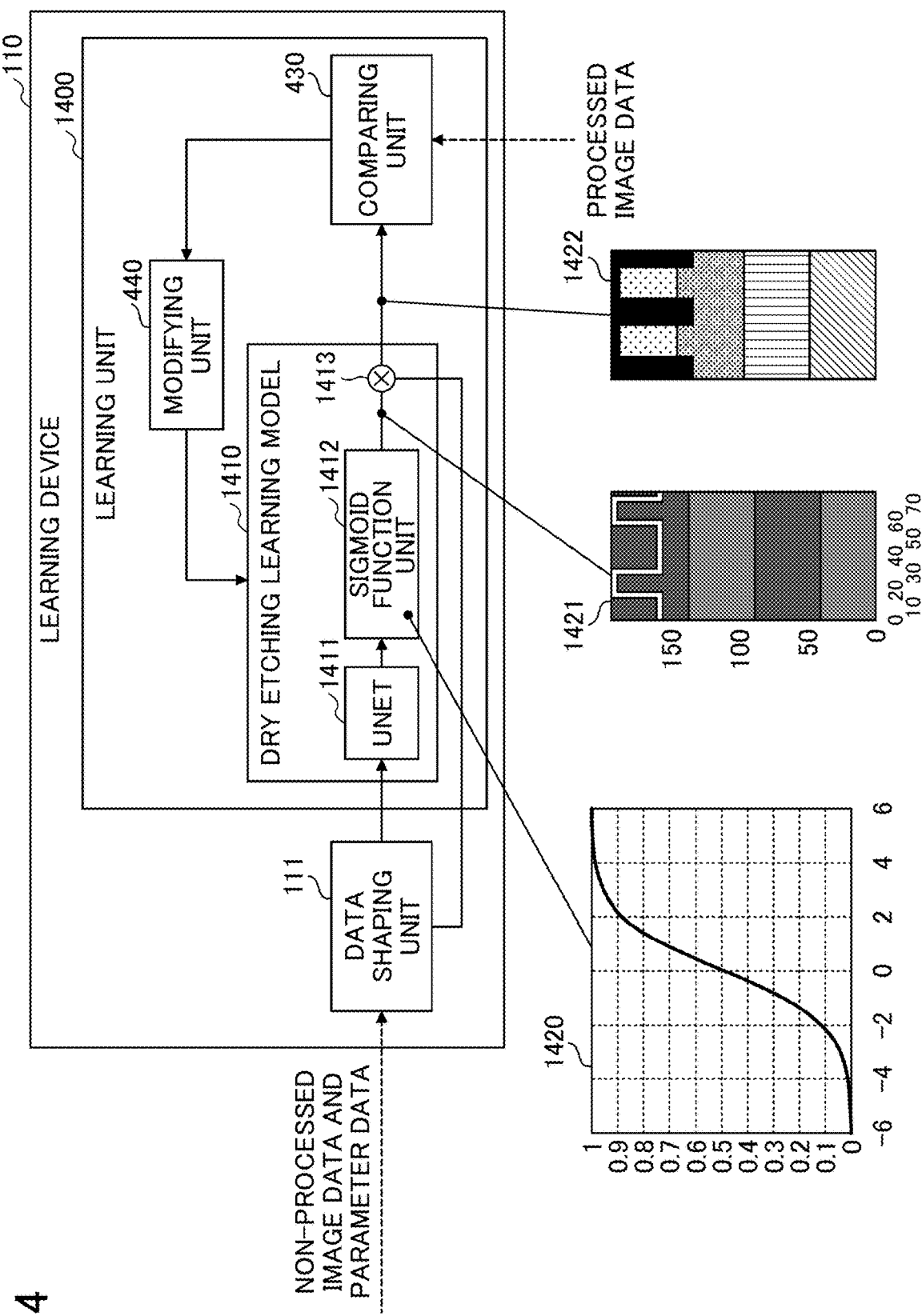
FIG. 14 is a drawing illustrating an example of a functional configuration of a learning unit of a learning device according to a third embodiment.

FIG. 14 is a drawing illustrating an example of a functional configuration of a learning unit of a learning device according to the third embodiment. An internal configuration within the learning model differs from the functional configuration of the learning unit 112 illustrated in FIG. 4. Here, the internal configuration within the learning model will be described using the dry etching learning model 1410, but the deposition learning model has substantially the same internal configuration.

As illustrated in FIG. 14, the dry etching learning model 1410 in the learning unit 1400 includes a sigmoid function unit 1412 and a multiplier 1413 in addition to the UNET 1411.

The sigmoid function unit 1412 is an example of a processing unit. As illustrated in FIG. 14, a first output result that is an output of the UNET 1411 is converted by a sigmoid function 1420 to output a second output result 1421.

The multiplier 1413 obtains the second output result 1421 from the sigmoid function unit 1412. The multiplier 1413 obtains the non-processed image data from the data shaping unit 111. The multiplier 1413 multiplies the obtained non-processed image data by the obtained second output result 1421 to notify a final output result 1422 to the comparing unit 430.

As described above, the dry etching learning model 1410 is configured to output the final output result 1422 by multiplying the non-processed image data, so that the image data representing the etch ratio is output from the UNET 1411 as the first output result when machine learning is performed on the dry etching learning model 1410.

Here, the etch rate indicates a value of the change rate that indicates how much a layer of each material included in the non-processed image data has been etched in the processed image data. By performing machine learning on the dry etching learning model 1410, the etch rate approaches a value obtained by dividing the processed image data by the non-processed image data. However, the first output result output from the UNET 1411 during machine learning may be any value.

In dry etching, there is a constraint condition (i.e., domain knowledge) that "materials do not increase over the course of processing" with respect to the change in shape. Thus, in dry etching, the etch rate is within the range from 0 to 1.

Here, the sigmoid function unit 1412 is a function that converts any value to a value from 0 to 1, and the above-described domain knowledge can be reflected by the sigmoid function unit 1412 converting the first output result to the second output result.

Although not illustrated in FIG. 14, substantially the same process can be performed in the deposition learning model by providing the sigmoid function unit, the multiplier, and the like. Specifically, as the first output result, image data representing the deposition rate is output from the UNET when machine learning is performed on the deposition learning model.

Here, the deposition rate indicates a value of the change rate that indicates how much a thin film is deposited in the processed image data for a layer of each material included in the non-processed image data. By performing machine learning on the deposition learning model, the deposition rate approaches a value obtained by dividing a difference between the non-processed image data and the processed image data by the non-processed image data. However, the first output result output from UNET during machine learning may be any value.

In deposition, there is a constraint condition (i.e., domain knowledge) that "materials do not decrease over the course of processing" with respect to the change in shape. Thus, in deposition, the deposition rate is within the range from 0 to 1.

As described above, the sigmoid function unit is a function that converts any value to a value from 0 to 1, and the domain knowledge can be reflected by the sigmoid function unit converting the first output result to the second output result.

As described above, according to the learning unit 1400 of the learning device 110 of the third embodiment, the domain knowledge can be reflected in the machine learning, and the simulation accuracy can be further improved.

Fourth Embodiment

In the first to third embodiments described above, the data shaping unit generates the concatenated data having a height and a width in accordance with the width and the height of the non-processed image data. However, the width and the height of the concatenated data generated by the data shaping unit are determined as desired, and the data shaping unit may be configured to compress the non-processed image data and generate the concatenated data. In the following, a fourth embodiment will be described focusing on differences between the fourth embodiment and the first to third embodiments described above.

<Details of a Functional Configuration of a Data Shaping Unit>

FIG. 15A and FIG. 15B are drawings illustrating an example of a functional configuration of a data shaping unit of a learning device according to the fourth embodiment. FIG. 15A illustrates a data shaping unit 1510 in which a compressing unit 1511 is added to the data shaping unit 111 of the learning device according to the first embodiment.

The compressing unit 1511 compresses the non-processed image data obtained by the shape data obtaining unit 501. The compressing unit 1511, for example, calculates an average value of pixel value of a adjacent pixels (n is an integer that is two or greater; for example, n=4 indicates two pixels in the vertical direction and two pixels in the horizontal direction), and the calculated average value is defined as a pixel value of one pixel that groups the n pixels. This enables the compressing unit 1511 to compress the non-processed image data by a factor of 1/n.

As described above, the compressing unit 1511 performs a compression process so that the composition ratio (or the content ratio) of the materials is maintained as much as possible over the course of compression in view of the fact that the non-processed image data is image data representing the composition ratio (or the content ratio) of the materials. The compression rate of the compression process performed by the compressing unit 1511 is not limited to an integer multiple, and in the compressing unit 1511, the compression process can be performed with a desired compression rate.

Similarly, FIG. 15B illustrates a data shaping unit 1520 in which a compressing unit 1511 is added to the data shaping unit 1200 of the learning device according to the second embodiment.

The compressing unit 1511 included in the data shaping unit 1520 has substantially the same function as the compressing unit 1511 included in the data shaping unit 1510. Thus, the detailed description is omitted here.

As described above, by adding the compressing unit 1511 to the data shaping unit 1510 or 1520, the size of the concatenated data that is input to the learning units 112 and 1400 (or the executing unit 122) can be reduced. As a result, according to the fourth embodiment, a learning time period required when the learning units 112 and 1400 perform machine learning or a simulation time period required when the executing unit 122 performs the simulation can be reduced.

Other Embodiments

In the first embodiment described above, the dry etching learning model 420 and the deposition learning model 421 are provided in the learning unit 112, and machine learning is performed separately using different training data.

However, dry etching and deposition may be simultaneously performed in a semiconductor manufacturing process. Assuming such a case, one learning model may be provided in the learning unit 112 so that machine learning can be performed with respect to a case in which dry etching and deposition are performed simultaneously.

In this case, the learning unit 112 performs machine learning on the one learning model by using training data including non-processed image data obtained before dry etching and deposition are performed and processed image data obtained after dry etching and deposition have been performed.

In the executing unit 131 of the simulation device 130, it is necessary to provide both the dry etching simulator 310 and the deposition simulator 320, but the learning unit 112 of the learning device 110 can integrate the learning models.

In the first embodiment described above, the non-processed image data and the processed image data have been described as two-dimensional image data. However, the non-processed image data and the processed image data are not limited to two-dimensional image data, but may be three-dimensional image data (what is called voxel data).

If the non-processed image data is two-dimensional image data, the concatenated data is an array of the number of channels×width×height. If the non-processed image data is three-dimensional image data, the concatenated data is an array of the number of channels×width×height×depth.

In the first embodiment described above, the two-dimensional image data is processed as it is. However, two-dimensional image data may be modified or three-dimensional image data may be modified for processing. For example, when three-dimensional image data is obtained, two-dimensional image data of a predetermined cross section may be generated, and the generated data may be input as non-processed image data. Alternatively, three-dimensional image data may be generated based on two-dimensional image data of successive predetermined cross sections and the generated data may be input as non-processed image data.

In the first embodiment described above, the channel data generator 502 generates channel data for a layer of air and each layer of a material. However, the method of generating channel data is not limited to this. The channel data generator 502 may generate channel data based on larger classifications, such as oxides, silicon, organics, nitrides, and so on, rather than based on specific film types.

In the first to fourth embodiments described above, the inference device 120 outputs the processed image data and terminates the process in response to the non-processed image data and parameter data being input. However, the configuration of the inference device 120 is not limited to this. For example, the embodiments may be configured to input, for example, the processed image data output by inputting the non-processed image data and the parameter data together with corresponding parameter data to the inference device 120 again. This enables the inference device 120 to continuously output shape changes. The corresponding parameter data can be changed as desired when the processed image data is input to the inference device 120 again.

In the first to fourth embodiments described above, the learning device 110, the inference device 120, and the simulation device 130 are illustrated separately. However, any two devices may be configured as a single unit, and all devices may be configured as a single unit.

In the first to fourth embodiments described above, one computer constitutes the learning device 110, but multiple computers may constitute the learning device 110. Similarly, in the first to fourth embodiments described above, one computer constitutes the inference device 120, but multiple computers may constitute the inference device 120.

In the first to fourth embodiments described above, the learning device 110, the inference device 120, and the simulation device 130 have been applied to a semiconductor manufacturing process, but it is needless to say that they may be applied to processes other than a semiconductor manufacturing process. The processes other than a semiconductor manufacturing process include manufacturing processes other than a semiconductor manufacturing process and non-manufacturing processes.

In the first to fourth embodiments described above, the learning device 110 and the inference device 120 are achieved by causing a general-purpose computer to execute various programs, but a method of achieving the learning device 110 and the inference device 120 is not limited to this.

For example, the learning device 110 and the inference device 120 may be achieved by a dedicated electronic circuit (i.e., hardware), such as an integrated circuit (IC) that implements a processor, memory, and the like. Multiple components may be implemented in one electronic circuit, one component may be implemented in multiple electronic circuits, and components and electronic circuits may be implemented on a one-to-one basis.

It should be noted that the present invention is not limited to the above-described configurations, such as the configurations described in the above-described embodiments, and combinations with other elements. In these respects, various modifications can be made within the scope of the invention without departing from the spirit of the invention, and the configurations may be appropriately determined according to an application form.

What is claimed is:

1. An inference method comprising:
generating, by at least one processor, second processed image data by inputting second non-processed image data and second parameter data of a simulator into a model, and
generating, by the at least one processor, third processed image data by inputting the second processed image data and third parameter data of the simulator into the model,
wherein the model has been trained so that first processed image data approaches first simulator processed image data, the first processed image data being generated by inputting first non-processed image data and first parameter data of the simulator for the first non-processed image data into the model, and the first simulator processed image data being generated by the simulator performing a simulation on the first non-processed image data by using the first parameter data.

2. The inference method as claimed in claim 1,
wherein the second non-processed image data being input into the model includes at least either the second non-processed image data or data obtained by performing a predetermined process on the second non-processed image data,
wherein the second parameter data being input into the model includes at least either the second parameter data or data obtained by performing a predetermined process on the second parameter data,
wherein the first non-processed image data being input into the model when the model is trained includes at least either the first non-processed image data or data obtained by performing a predetermined process on the first non-processed image data, and
wherein the first parameter data being input into the model when the model is trained includes at least either the first parameter data or data obtained by performing a predetermined process on the first parameter data.

3. The inference method as claimed in claim 1, further comprising:
processing, by the at least one processor, the second parameter data into a format in accordance with the second non-processed image data,
wherein the second parameter data being input into the model is the processed second parameter data.

4. The inference method as claimed in claim 3, wherein the processing of the second parameter data includes processing, by the at least one processor, the second parameter data into a format of a two-dimensional array in accordance with a width and a height of the second non-processed image data.

5. The inference method as claimed in claim 1, further comprising:
inputting, by the at least one processor, the second parameter data into another model,
wherein the second parameter data being input into the model is an output from the another model.

6. The inference method as claimed in claim 5, wherein the second parameter data being input into the another model is normalized parameter data.

7. The inference method as claimed in claim 5, wherein the model and the another model are neural networks.

8. The inference method as claimed in claim 1, further comprising:
compressing, by the at least one processor, the second non-processed image data,
wherein the second non-processed image data being input into the model is the compressed second non-processed image data.

9. The inference method as claimed in claim 1, wherein the model outputs the second processed image data.

10. The inference method as claimed in claim 1, wherein the second processed image data is generated by the at least one processor based on an output from the model and the second non-processed image data.

11. The inference method as claimed in claim 10, wherein the model outputs information related to a change rate relative to the second non-processed image data.

12. The inference method as claimed in claim 11,
wherein the simulator is related to a semiconductor manufacturing process, and
wherein the change rate is a value related to at least either an etch rate or a deposition rate.

13. The inference method as claimed in claim 11,
wherein the change rate is within a range from 0 to 1.

14. The inference method as claimed in claim 1, wherein the second non-processed image data is three-dimensional image data.

15. The inference method as claimed in claim 1, wherein the simulator is based on a physical model.

16. The inference method as claimed in claim 1, wherein the simulator is related to a semiconductor manufacturing process.

17. The inference method as claimed in claim 16, wherein the second non-processed image data is image data representing a shape of a wafer.

18. The inference method as claimed in claim 16, wherein the second non-processed image data has values in accordance with at least either composition ratios or content ratios of materials to be processed in the semiconductor manufacturing process.

19. The inference method as claimed in claim 16, wherein the second non-processed image data has a plurality of channel data corresponding to materials to be processed in the semiconductor manufacturing process.

20. The inference method as claimed in claim 16, wherein the second non-processed image data includes layers of materials to be processed in the semiconductor manufacturing process and a layer of air.

21. The inference method as claimed in claim 16,
wherein the simulator is configured to perform a simulation related to etching, and
wherein the second parameter data includes information related to at least one of an etch ratio, an etch lateral ratio, or an etch depth.

22. The inference method as claimed in claim 16,
wherein the simulator is configured to perform a simulation related to deposition, and
wherein the second parameter data includes information related to the deposition.

23. The inference method as claimed in claim 1, wherein the model is a neural network.

24. A simulation method comprising:
training, by at least one processor, a model so that processed image data approaches simulator processed image data, the processed image data being generated by inputting non-processed image data and parameter data of a simulator for the non-processed image data into the model, the simulator processed image data being generated by the simulator performing a simulation on the non-processed image data by using the parameter data,
generating, by the at least one processor and after the model is trained, second processed image data by inputting second non-processed image data and second parameter data of the simulator into the model, and
generating, by the at least one processor, third processed image data by inputting the second processed image data and third parameter data of the simulator into the model.

25. The simulation method as claimed in claim 24, further comprising:
generating, by the using the simulator, the simulator processed image data by performing the simulation on the non-processed image data by using the parameter data.

26. An inference device comprising:
at least one memory; and
at least one processor,
wherein the at least one memory stores a model that has been trained so that first processed image data approaches first simulator processed image data, the first processed image data being generated by inputting first non-processed image data and first parameter data of a simulator for the first non-processed image data into the model, and the first simulator processed image data being generated by the simulator performing a simulation on the first non-processed image data by using the first parameter data,
wherein the at least one processor generates second processed image data by inputting second non-processed image data and second parameter data of the simulator into the model, and
wherein the at least one processor further generates third processed image data by inputting the second processed image data and third parameter data of the simulator into the model.

27. An learning device A simulation system comprising:
at least one memory; and
at least one processor,
wherein the at least one processor trains a model so that processed image data approaches simulator processed image data, the processed image data being generated by inputting non-processed image data and parameter data of a simulator for the non-processed image data into the model, and the simulator processed image data being generated by the simulator performing a simulation on the non-processed image data by using the parameter data,
wherein the at least one processor generates, after the model is trained, second processed image data by inputting second non-processed image data and second parameter data of the simulator into the model, and
wherein the at least one processor further generates third processed image data by inputting the second processed image data and third parameter data of the simulator into the model.

28. The simulation system as claimed in claim 27, wherein the at least one processor generates, by using the simulator, the simulator processed image data by performing the simulation on the non-processed image data by using the parameter data.

29. The simulation system as claimed in claim 27, wherein the simulator is related to a semiconductor manufacturing process.

* * * * *